United States Patent [19]
Abe

[11] Patent Number: 5,535,155
[45] Date of Patent: Jul. 9, 1996

[54] SRAM CELL HAVING LOAD THIN FILM TRANSISTORS

[75] Inventor: Kazuhiko Abe, Tokyo, Japan

[73] Assignee: NEC Corporation, Japan

[21] Appl. No.: 498,173

[22] Filed: Jul. 5, 1995

[30] Foreign Application Priority Data

Jul. 5, 1994 [JP] Japan ..................................... 6-174882

[51] Int. Cl.$^6$ ................ G11C 11/0; H01L 27/02
[52] U.S. Cl. ................ 365/154; 365/156; 257/393; 257/903
[58] Field of Search ..................... 365/154, 156; 257/393, 903, 351, 369, 271, 274

[56] References Cited

U.S. PATENT DOCUMENTS

| | | | |
|---|---|---|---|
| 5,281,843 | 1/1994 | Ochii et al. | 365/154 |
| 5,309,010 | 5/1994 | Kitajima | 257/347 |
| 5,384,731 | 1/1995 | Kuriyama et al. | 365/154 |
| 5,404,326 | 4/1995 | Okamoto | 365/156 |
| 5,438,537 | 8/1995 | Sasaki | 365/154 |

FOREIGN PATENT DOCUMENTS

0426174 5/1991 European Pat. Off.

OTHER PUBLICATIONS

Ohkubo et al; "16 Mbit SRAM Cell Technologies for 2.0 V Operation"; Dec. 8, 1991; pp. 91, 482–484; IEEE Publishers.

Sasaki et al, A 23-ns 4-Mb CMOS SRAM with 0.2-uA Standby Current, IEEE Journal of Solid-State Circuits, vol. 25, No. 5, pp. 1075–1081, Oct. 1990.

Primary Examiner—David C. Nelms
Assistant Examiner—Huan Hoang
Attorney, Agent, or Firm—Hayes, Soloway, Hennessey, Grossman & Hage

[57] ABSTRACT

In a static random access memory device including a flip-flop having first and second load thin film transistors whose drains are connected via first and second transfer bulk transistors to first and second bit lines, respectively, the second bit line is arranged over the first load thin film transistor, and the first bit line is arranged over the second load thin film transistor.

7 Claims, 29 Drawing Sheets

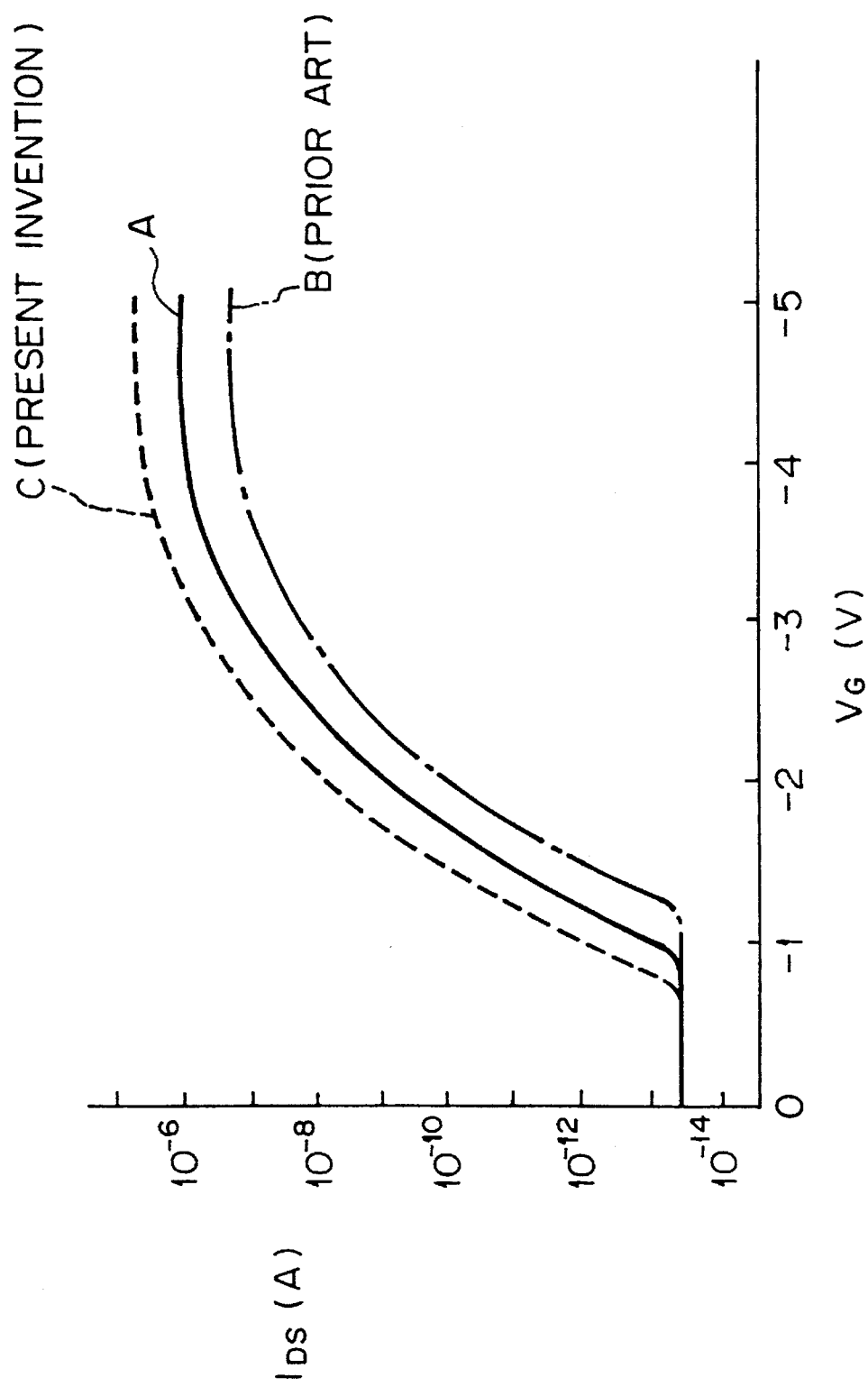

5,535,155

SRAM CELL HAVING LOAD THIN FILM TRANSISTORS

BACKGROUND OF THE INVENTION

1. Field of the Invention

The present invention relates to a static random access memory (SRAM) cell having thin film transistors.

2. Description of the Related Art

Generally, an SRAM cell is constructed by a flip-flop formed by cross-coupled inverters, and transfer gates between the nodes of the flip-flop and bit lines.

Also, in a prior art SRAM cell, in order to reduce the cell size, each of the inverters is constructed by a load P-channel thin film transistor (TFT) and a drive N-channel MOS (bulk) drive transistor. In this case, the bit lines form parasitic thin film transistors with source-channel-drain layers of the load thin film transistors. This will be explained later in detail.

In the above-described prior art SRAM cell, however, the parasitic thin film transistors are operated so as to impede the operation of the load thin film transistors. As a result, it is difficult to operate the SRAM cell at a lower voltage, and also, the stability of the SRAM cell is reduced.

SUMMARY OF THE INVENTION

It is an object of the present invention to be able to operate an SRAM cell having load thin film transistors at a lower voltage, thus enhancing the stability of the SRAM cell.

According to the present invention, in a static random access memory device including a flip-flop having first and second load thin film transistors whose drains are connected via first and second transfer bulk transistors to first and second bit lines, respectively, the second bit line is arranged over the first load thin film transistor, and the first bit line is arranged over the second load thin film transistor. Thus, the parasitic thin film transistors formed by the bit lines are operated so as to enhance the operation of the load thin film transistors.

BRIEF DESCRIPTION OF THE DRAWINGS

The present invention will be more clearly understood from the description as set forth below, as compared with the prior art, with reference to the accompanying drawings, wherein:

FIG. 7 is a graph for showing source-to-drain current characteristics of the load thin film transistor of FIG. 1;

DESCRIPTION OF THE PREFERRED EMBODIMENTS

Before the description of the preferred embodiments, a prior art SRAM cell will be explained with reference to FIGS. 1, 2A, 2B, 3A, 3B, 4A, 4B, 5A, 5B, 6A, and 6B.

Figure 1:
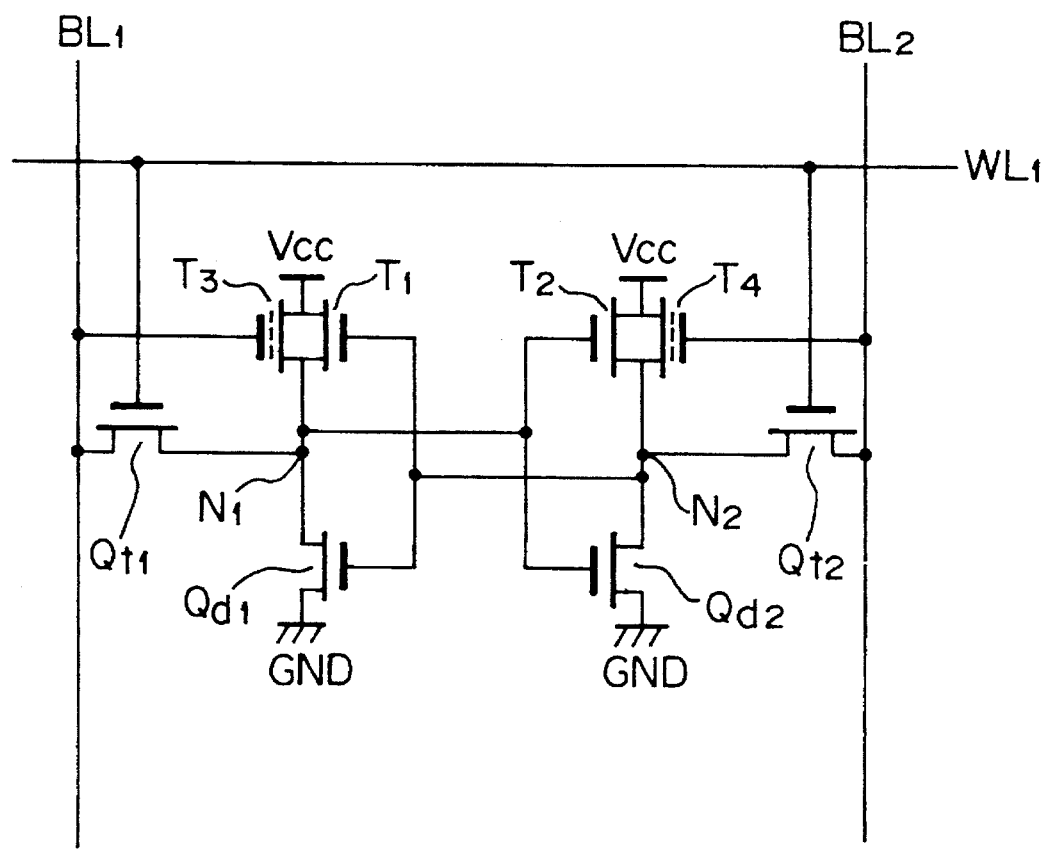
FIG. 1 is a circuit diagram illustrating a prior art SRAM cell.

In FIG. 1, which is a circuit diagram illustrating the prior art SRAM cell, one memory cell is provided at each intersection between a word line $WL_1$ and two bit lines $BL_1$ and $BL_2$. This memory cell is constructed by a flip-flop formed by two cross-coupled inverters, and two transfer N-channel MOS (bulk) transistors $Q_{t1}$ and $Q_{t2}$ connected between nodes $N_1$ and $N_2$ of the flip-flop and the bit lines $BL_1$ and $BL_2$. The transfer transistors $Q_{t1}$ and $Q_{t2}$ are controlled by the voltage at the word line $WL_1$.

Each of the inverters includes a load P-channel thin film transistor $T_1$ ($T_2$) and a drive N-channel MOS (bulk) transistor $Q_{d1}$ ($Q_{d2}$) between a high power supply line $V_{CC}$ and a ground line GND.

Note that parasitic thin film transistors $T_3$ and $T_4$ will be explained later.

When the voltage at the word line $WL_1$ is made high to turn ON the transfer transistors $Q_{t1}$ and $Q_{t2}$, data from the bit lines $BL_1$ and $BL_2$ is written into the nodes $N_1$ and $N_2$ of the flip-flop, or data is read from the nodes $N_1$ and $N_2$ to the bit lines $BL_1$ and $BL_2$, respectively.

The structure of the SRAM cell of FIG. 1 is explained with reference to FIGS. 2A, 2B, 3A, 3B, 4A, 4B, 5A, 5B, 6A and 6B, which show manufacturing steps thereof.

Figure 2A:
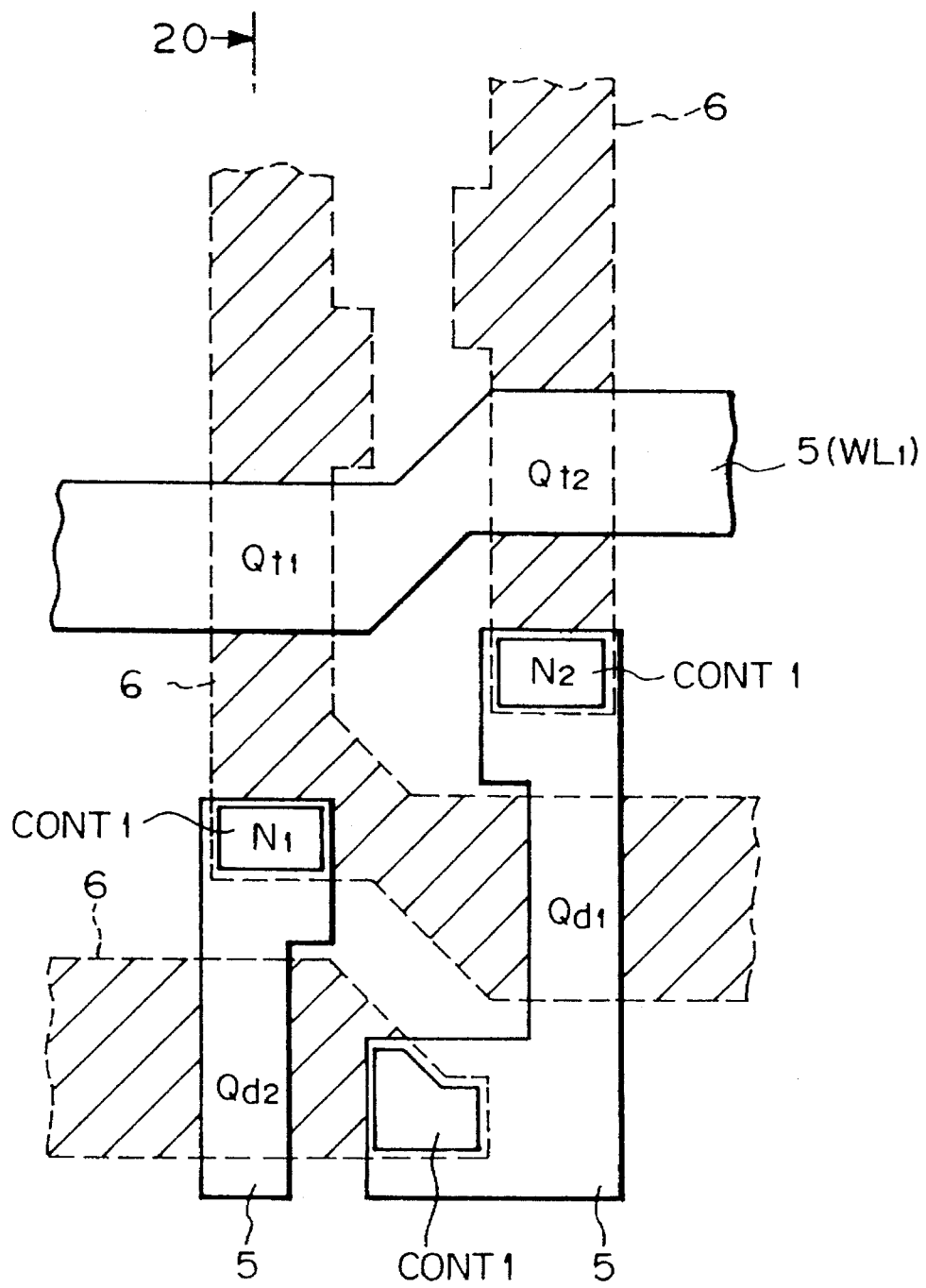
FIGS. 2A, 3A, 4A, 5A and 6A are plan views for explaining a method for manufacturing the SRAM cell of FIG. 1.
Figure 2B:
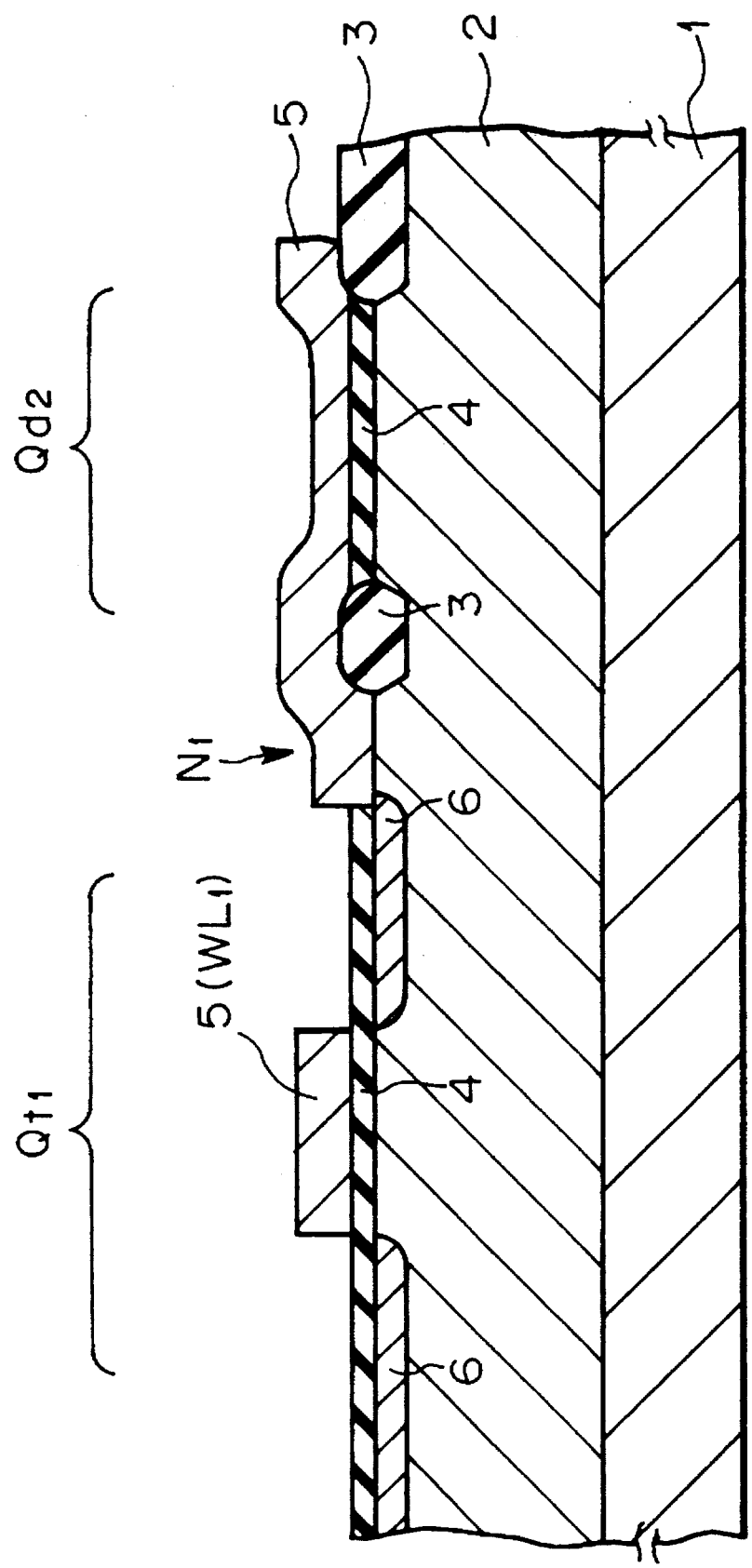
FIGS. 2B, 3B, 4B, 5B and 6B are cross-sectional views along the lines 20—20 of FIGS. 2A, 3A, 4A, 5A and 6A, respectively.

First, referring to FIGS. 2A and 2B, P-type impurities such as borons are ion-implanted into an N-type monocrystalline silicon substrate 1, and a heat operation is carried out to form a P-type well layer 2. Next, a local oxidation of silicon (LOCOS) is performed upon the P-type well layer 2 with a mask of silicon nitride (not shown) to create a thick field silicon oxide layer 3. Next, a thin gate silicon oxide layer 4 is formed by thermally oxidizing the P-type well layer 2. Then, polycrystalline silicon is deposited by a chemical vapor deposition (CVD) process, and is patterned by a photolithography and dry etching process, to form first polycrystalline silicon layers 5 for gate electrodes of the transfer transistors $Q_{t1}$ and $Q_{t2}$ and the drive transistors $Q_{d1}$ and $Q_{d2}$. Then, N-type impurities such as arsenic are ion-implanted into the P-type well layer 2 with a mask of the first polycrystalline silicon layers 5, to create N-type impurity regions (i.e., source regions and drain regions) 6. In this case, the first polycrystalline silicon layers 5 are connected at contact holes CONT1 to the N-type impurity regions 6.

Figure 3A:
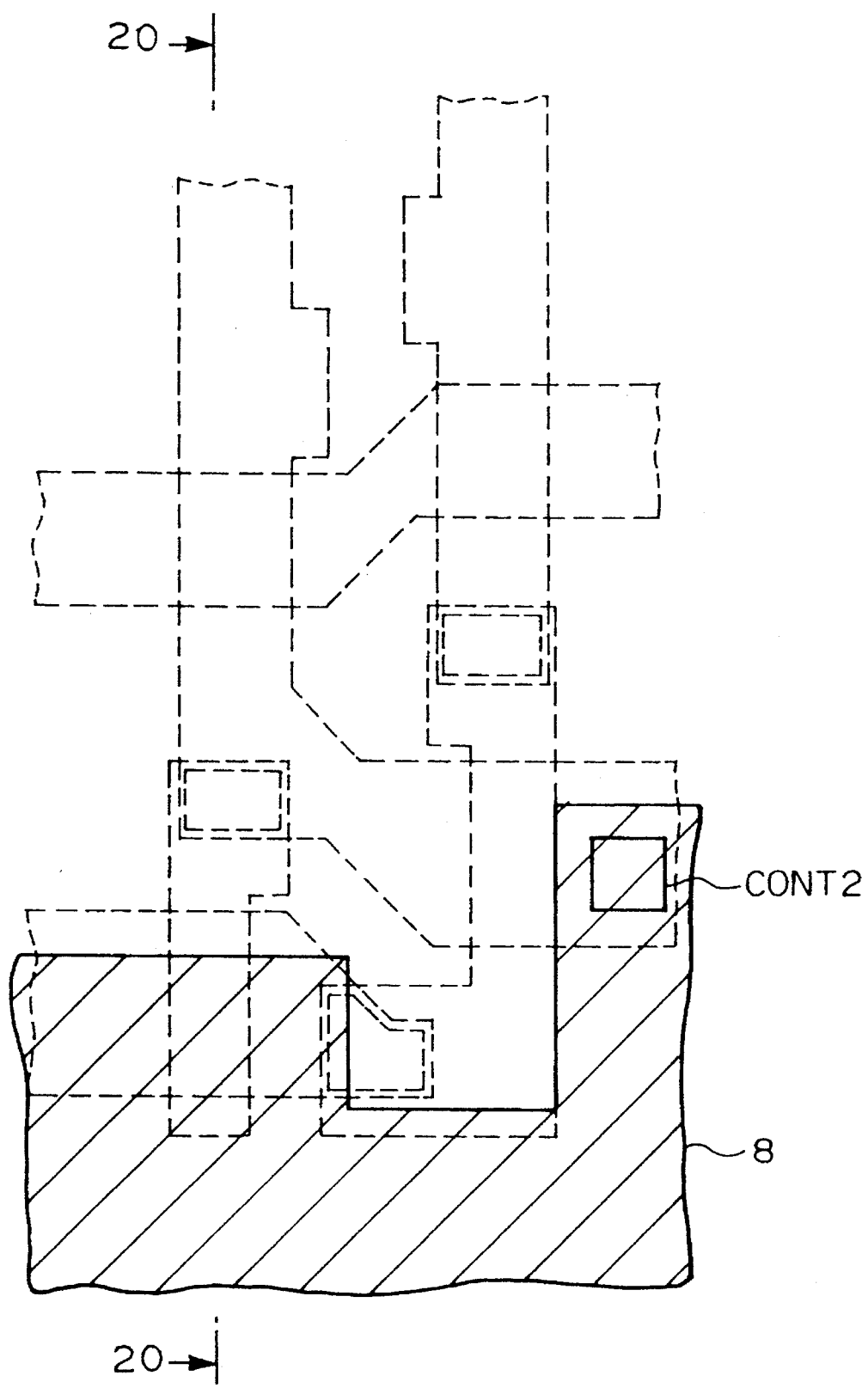
Figure 3B:
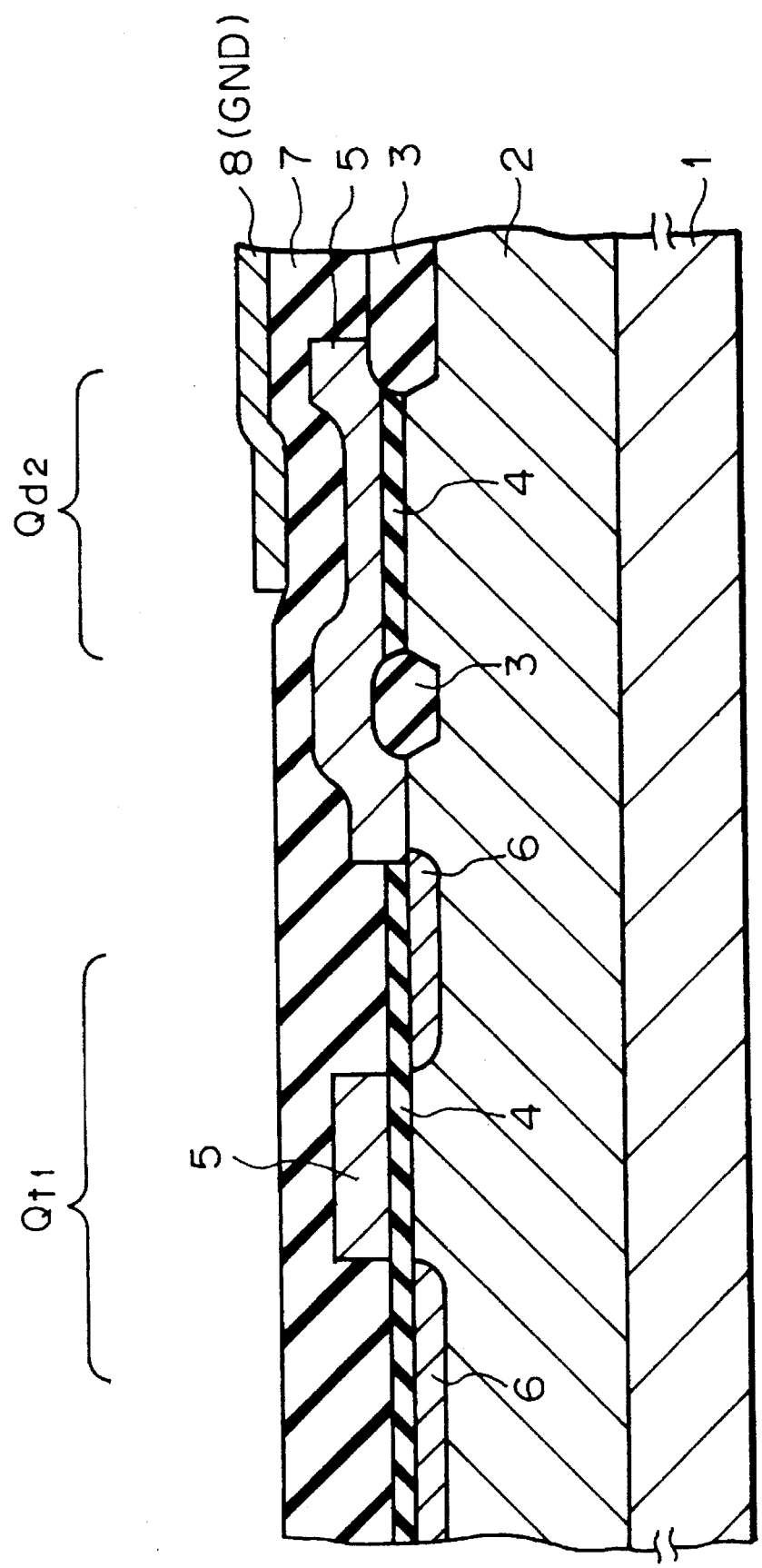

Next, referring to FIGS. 3A and 3B, a silicon oxide layer 7 is deposited by a CVD process, and then, a contact hole CONT2 is perforated in the silicon oxide layer 7. Then, a second polycrystalline silicon layer 8 is deposited and is patterned. This second polycrystalline silicon layer 8 serves as the ground line GND.

Figure 4A:
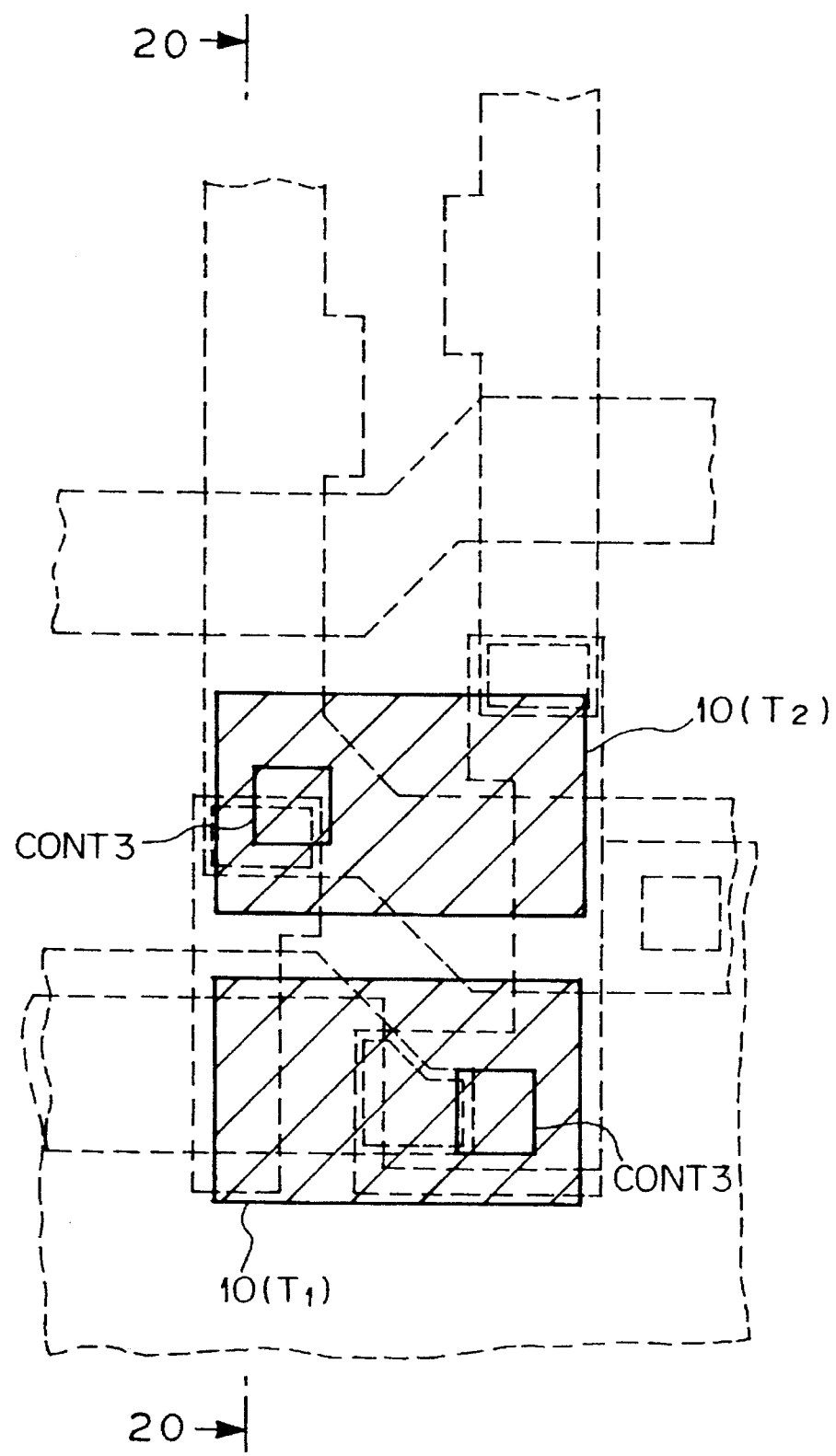
Figure 4B:
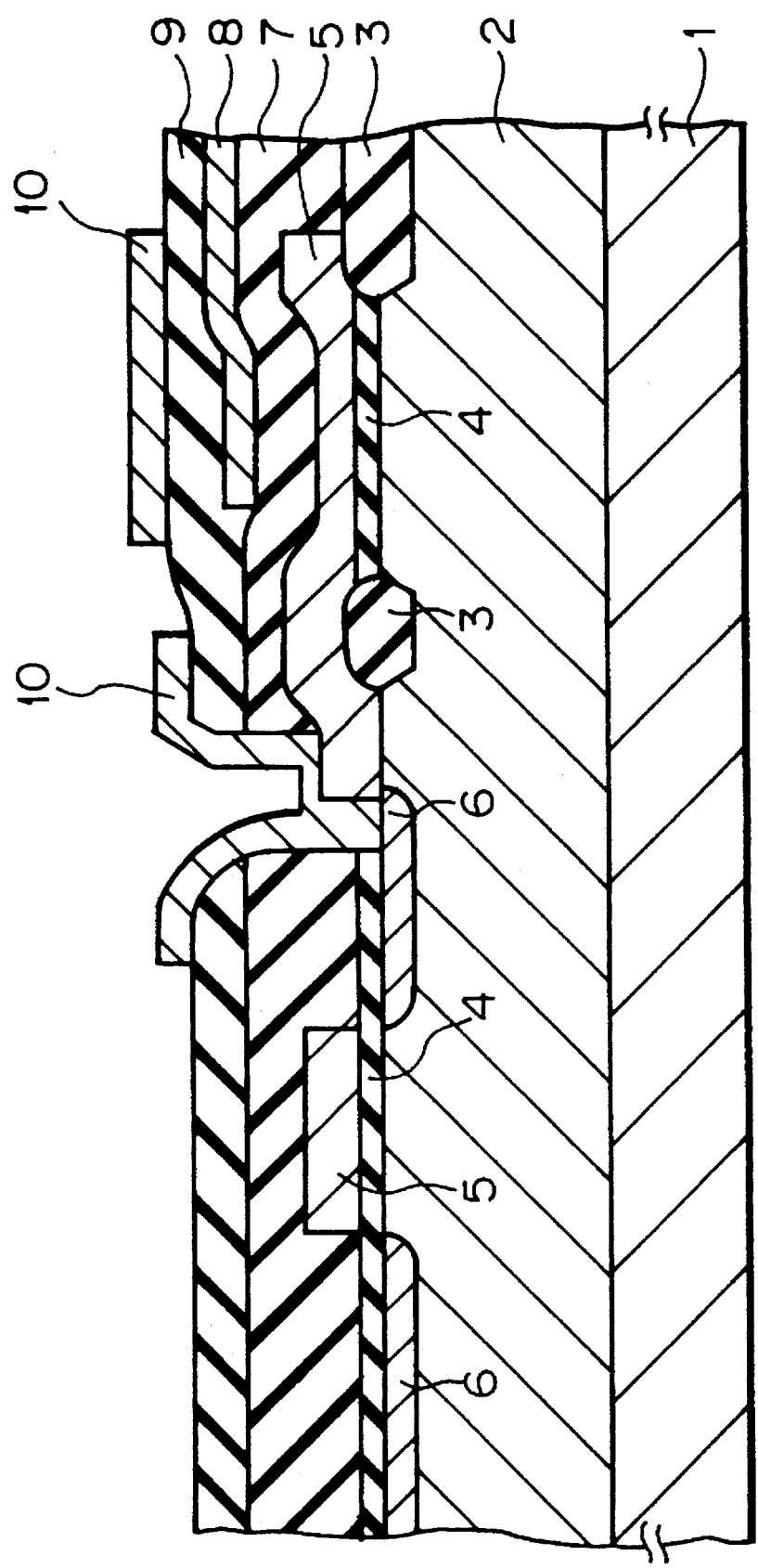

Next, referring to FIGS. 4A and 4B, a silicon oxide layer 9 is deposited by a CVD process, and then, a contact hole CONT3 is perforated in the silicon oxide layer 9. Then, third polycrystalline silicon layers 10 are deposited and patterned. The third polycrystalline silicon layers 10 serve as the gate electrodes of the load thin film transistors $T_1$ and $T_2$.

Figure 5A:
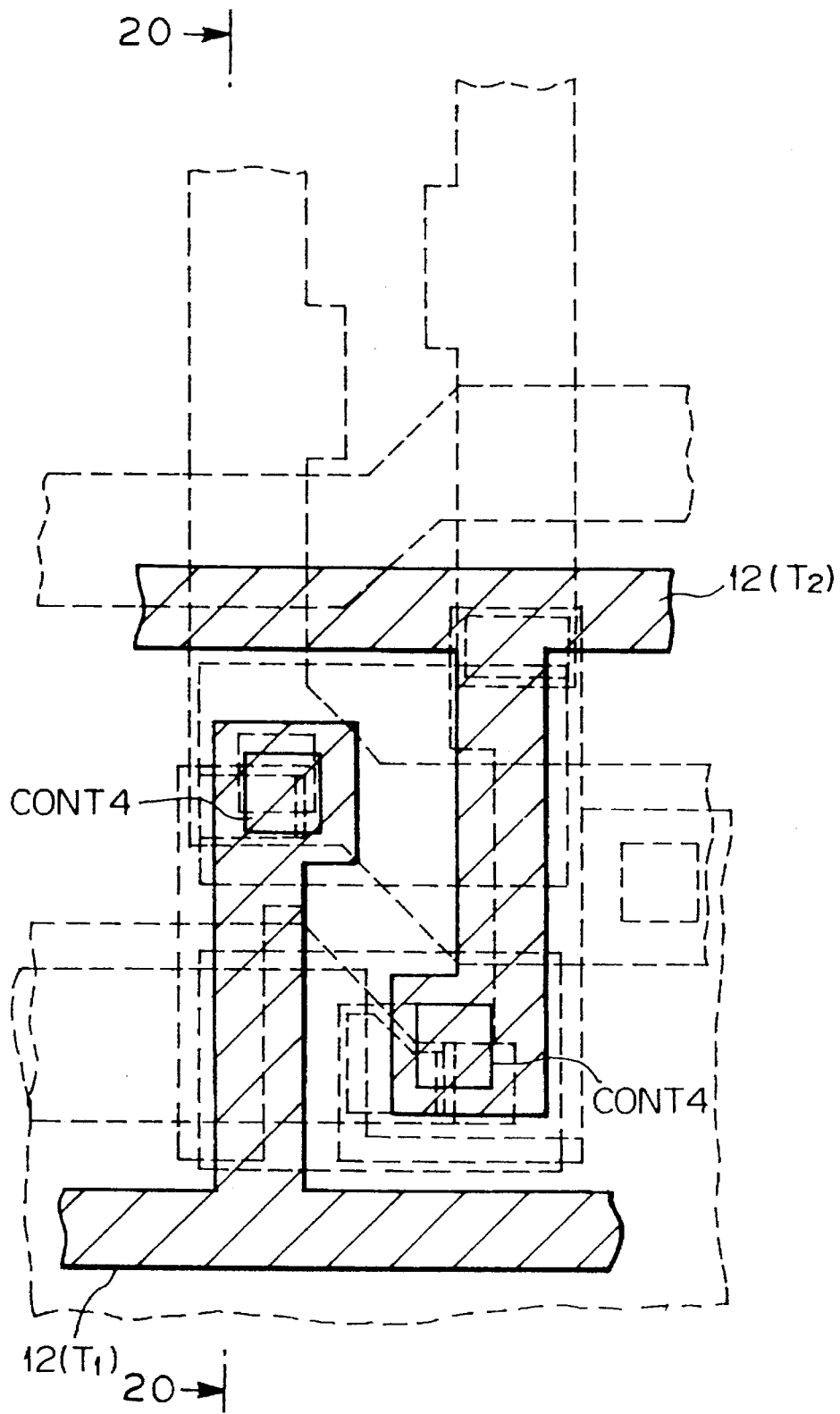
Figure 5B:
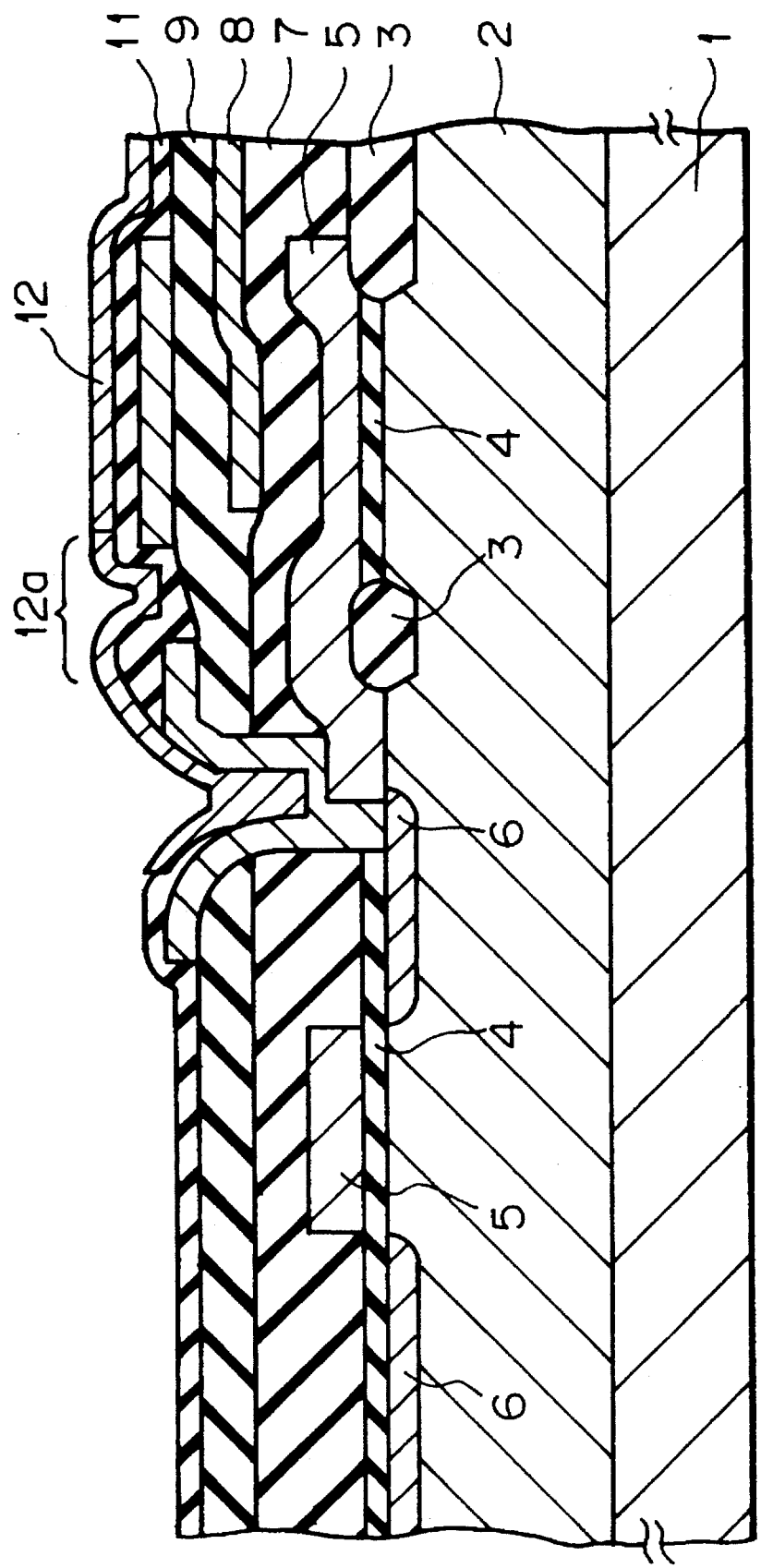

Next, referring to FIGS. 5A and 5B, a silicon oxide layer 11 is deposited by a CVD process, and then, a contact hole CONT4 is perforated in the silicon oxide layer 11. Then, amorphous silicon is deposited by a CVD process, and a heat operation is performed thereon to change the amorphous silicon to polycrystalline silicon. The polycrystalline silicon is patterned to form fourth polycrystalline silicon layers 12. The fourth polycrystalline silicon layers 12 serve as source-channel-drain regions of the thin film transistors $T_1$ and $T_2$. Usually, in order to reduce the OFF current of the thin film transistors $T_1$ and $T_2$, a lean P-type impurity region 12a is provided in each of the drain regions of the thin film transistors $T_1$ and $T_2$, to thereby relax an electric field applied to the drain regions of the thin film transistors $T_1$ and $T_2$. For this purpose, P-type impurities such as boron fluoride are ion-implanted into an area indicated by 12a in the fourth polycrystalline silicon layer 12.

Figure 6A:
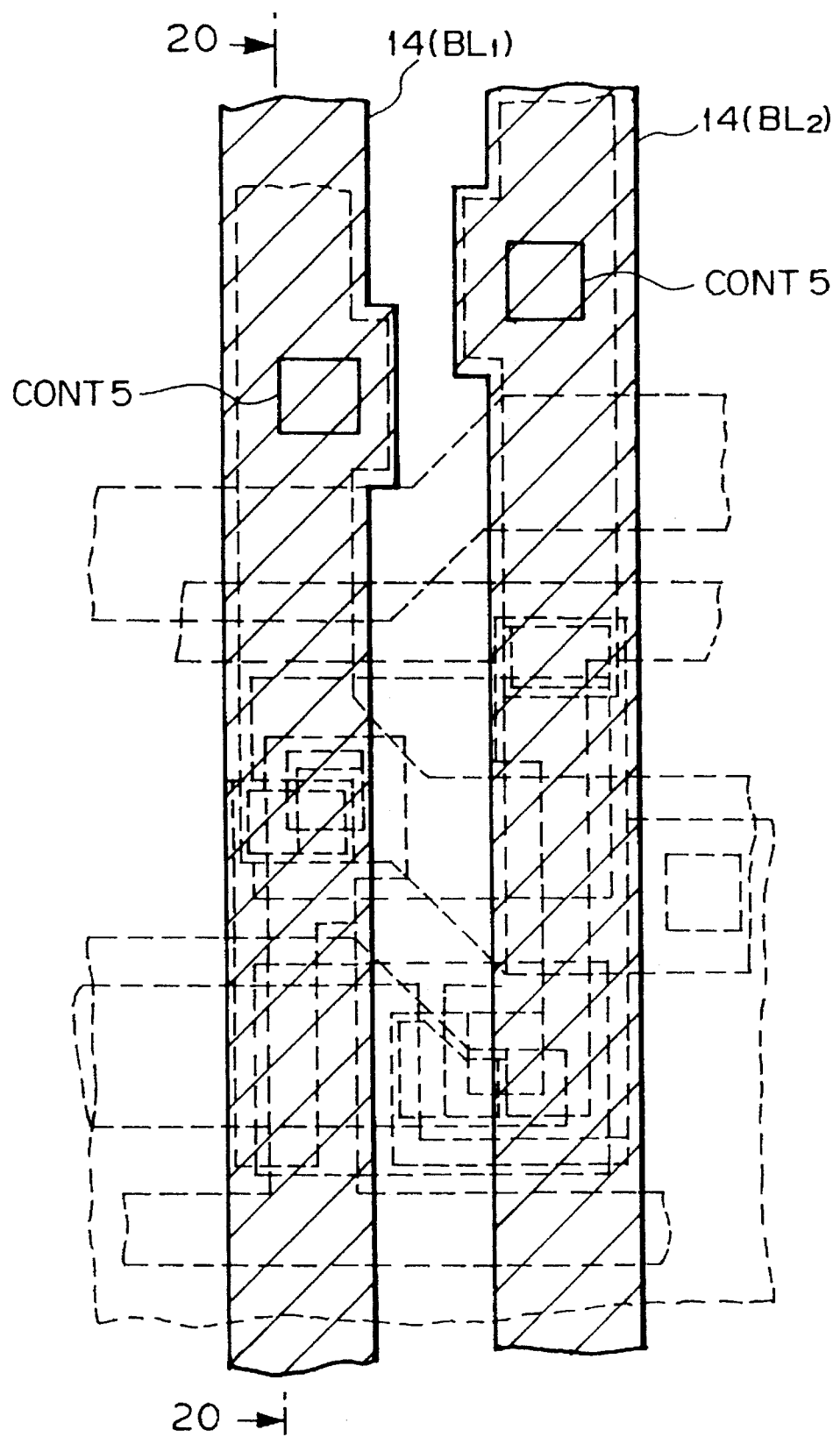
Figure 6B:
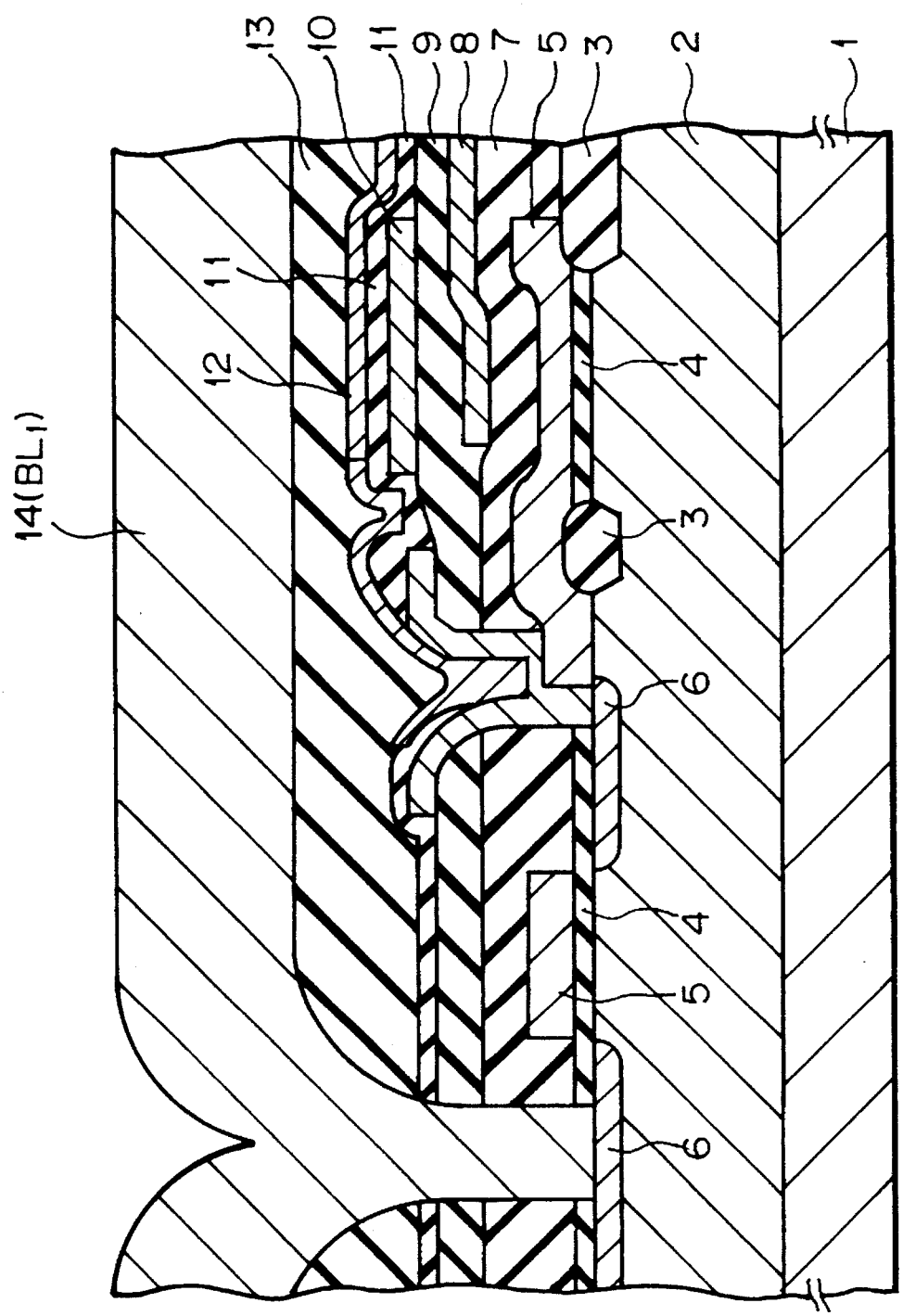

Finally, referring to FIGS. 6A and 6B, a silicon oxide layer 13 is deposited by a CVD process, and then, contact holes CONT5 are perforated in the silicon oxide layer 13. Then, aluminum alloy is deposited by sputtering, and then is patterned to form aluminum layers 14. The aluminum layers 14 serve as the bit lines $BL_1$ and $BL_2$, and are connected to the impurity regions 6, i.e., the drain regions of the transfer transistors $Q_{t1}$ and $Q_{t2}$.

As illustrated in FIGS. 6A and 6B, since the aluminum layer 14 (the bit line $BL_1$) is arranged over the source-channel-drain layer 13 of the thin film transistor $T_1$, the parasitic thin film transistor $T_3$ as illustrated in FIG. 1 is constructed by the bit line $BL_1$ and the source-channel-drain layer 13 of the thin film transistor $T_1$. Similarly, since the aluminum layer 14 (the bit line $BL_2$) is arranged over the source-channel-drain layer 13 of the thin film transistor $T_2$, the parasitic thin film transistor $T_4$ as illustrated in FIG. 1 is constructed by the bit line $BL_2$ and the source-channel-drain layer 13 of the thin film transistor $T_2$.

A write opration of the SRAM cell as illustrated in FIGS. 2A, 2B, 3A, 3B, 4A, 4B, 5A, 5B, 6A and 6B is explained next in detail with reference to FIG. 1.

Assume that data "1" is witten into the SRAM cell of FIG. 1, and in this case, voltage at the bit line $BL_1$ is $V_{CC}$ and the voltage at the bit line $BL_2$ is GND.

When the voltage at the word line $WL_1$ is made high (=$V_{CC}$), the voltage $V_{N2}$ at the node $N_2$ becomes GND, since the transfer transistor $Q_{t2}$ is of an enhancement type, i.e., $$V_{N2}=GND$$

Conversely, the voltage $V_{N1}$ at the node $N_1$ becomes lower than $V_{CC}$ due to the enhancement type of the transfer transistor $Q_{t1}$, i.e., $$V_{N1}=V_{CC}-V_{th}-\alpha$$

where $V_{th}$ is a threshold voltage of the transfer transistors $Q_{t1}$ and $Q_{t2}$; and $\alpha$ is a voltage determined by the substrate bias effect. For example, $V_{CC}$=5 V, $V_{th}$=0.7 V, and $\alpha$=0.7 V, then, $$V_{N1}=3.6 \text{ V}$$

The stability of the SRAM cell is dependent upon a ratio of a current ability of the drive transistors $Q_{d1}$ and $Q_{d2}$ to a current ability of the transfer transistors $Q_{t1}$ and $Q_{t2}$ and is generally larger than 3:1. However, as stated above, when the voltage $V_{N1}$ at the node $N_1$ is 3.6 V, the drain-to-source current flowing through the drive transistor $Q_{d1}$ is decreased to further reduce the current ability thereof. This makes the SRAM cell unstable.

On the other hand, since the ground voltage GND is applied to the thin film transistor $T_1$, so that the thin film transistor $T_1$ is turned ON, the node $N_1$ is charged up to $V_{CC}$. In this case, a charging time is dependent upon a time constant $\tau$=CR where R is the resistance of the thin film transistor $T_1$ and C is the capacitance of the node $N_1$. Since it is difficult to reduce the capacitance C of the node $N_1$ in view of soft errors, the ON current of the thin film transistor $T_1$ ($T_2$) has to be increased. However, since the grain size of polycrystalline silicon in the source-channel drain layer of the thin film transistor $T_1$ ($T_2$) is large, the mobility of charges therein is so small that the ON current of the thin film transistor $T_1$ ($T_2$) is small. Also, the lean impurity region 12a of the drain region of the thin film transistor $T_1$ ($T_2$) serves as a resistor, and therefore, the ON current of the thin film transistor $T_1$ ($T_2$) is further reduced, particularly when a low voltage is applied to the source-to-gate thereof.

Next, the parasitic thin film transistor $T_3$ ($T_4$) will be explained with reference to FIG. 7. In FIG. 7, a curve A designates a source-to-drain current characteristic of the thin film transistor $T_1$ where the parasitic thin film transistor $T_3$ is absent. On the other hand, when the parasitic thin film transistor $T_3$ is present through the bit line $BL_1$ to which the power supply voltage $V_{CC}$ is applied, the thin film transistor $T_1$ is operated to be in an OFF state as indicated by a curve B is FIG. 7, that is, the absolute value of the threshold voltage of the thin film transistor $T_1$ is substantially increased.

Thus, when data "1" is written into the SRAM cell of FIG. 1, since the absolute value of the threshold voltage of the thin film transistor $T_1$ is substantially increased by the parasitic thin film transistor $T_3$, the operation of the thin film transistor $T_1$ is impeded by the parasitic thin film transistor $T_3$. That is, the ON current of the thin film transistor $T_1$ is decreased, and as a result, it takes a long time to charge the node $N_1$ up to $V_{CC}$. Therefore, when the power supply voltage $V_{CC}$ is changed from 5 V to 3 V, a margin of the operation of the SRAM cell of FIG. 1 is reduced, i.e., the operation of the SRAM cell of FIG. 1 is unstable.

Note that, if a parasitic thin film transistor is present through the bit line $BL_1$ ($BL_2$) to which the ground voltage GND is applied, the thin film transistor $T_1$ ($T_2$) is operated to be in an ON state as indicated by a curve C in FIG. 7, that is, the absolute value of the threshold voltage of the thin film transistor $T_1$ ($T_2$) is substantially decreased. This reduces a time for charging the node $N_1$ up to $V_{CC}$.

Figure 8:
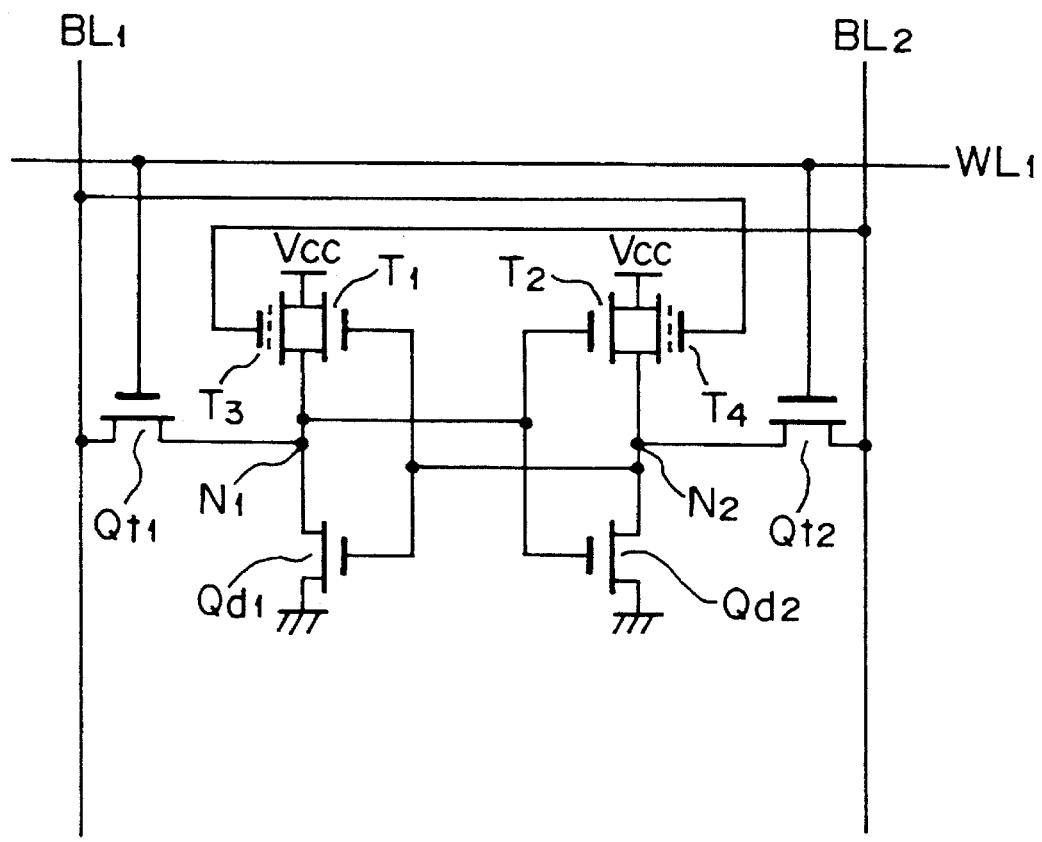
FIG. 8 is a circuit diagram illustrating a first embodiment of the SRAM cell according to the present invention.

In FIG. 8, which is a circuit diagram illustrating a first embodiment of the SRAM cell according to the present invention, in order to realize the drain-to-source current characteristics as indicated by the curve C in FIG. 7, the bit line $BL_2$ is arranged close to the thin film transistor $T_1$, so that the parasitic thin film transistor $T_3$ is controlled by the voltage at the bit line $BL_2$. Similarly, the bit line $BL_1$ is arranged close to the thin film transistor $T_2$, so that the parasitic thin film transistor $T_4$ is controlled by the voltage at the bit line $BL_1$.

The structure of the SRAM cell of FIG. 8 is explained next with reference to FIGS. 9A, 9B, 10A, 10B, 11A, 11B, 12A, 12B, 13A and 13B, which show manufacuring steps thereof.

Figure 9A:
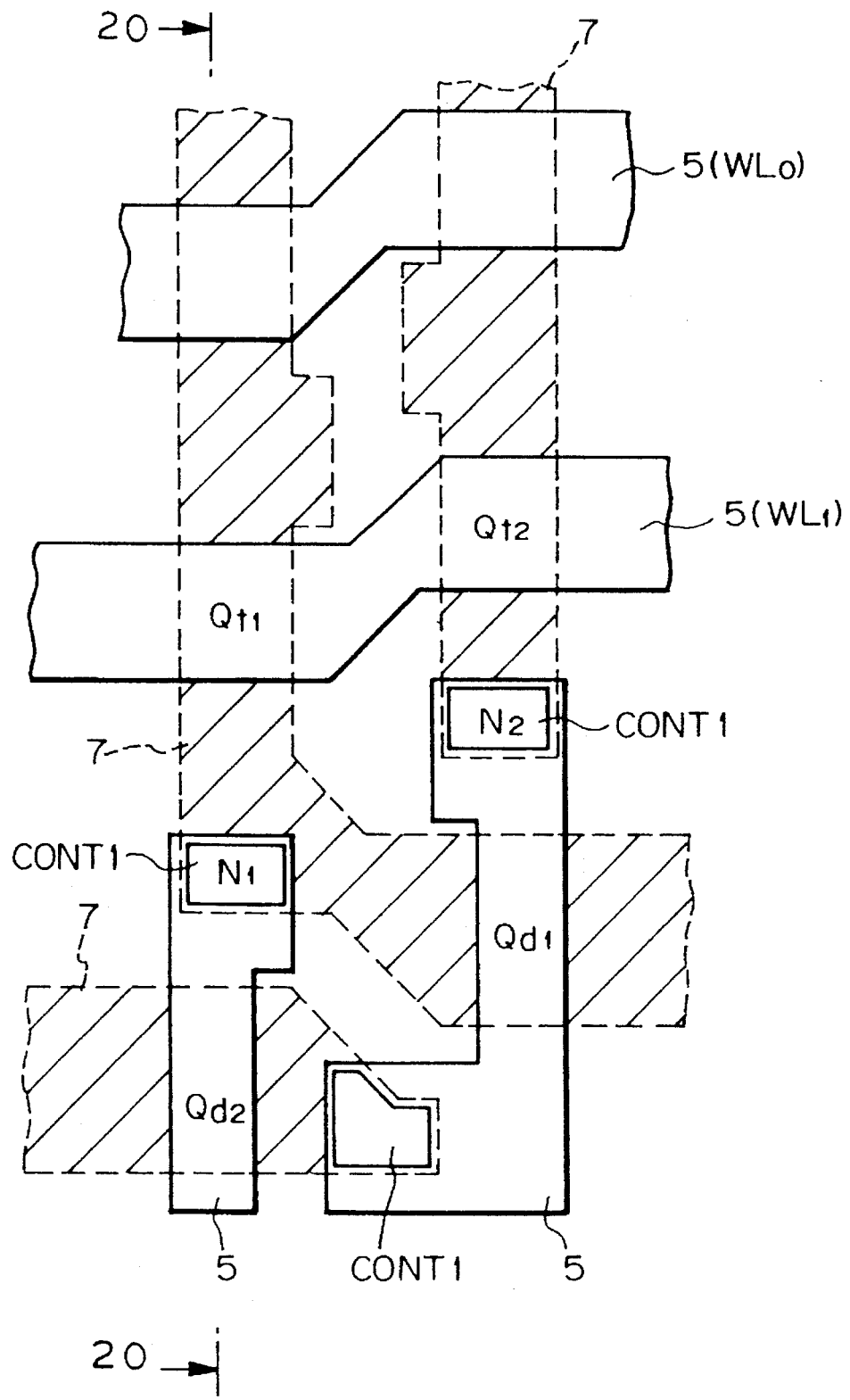
FIGS. 9A, 10A, 11A, 12A and 13A are plan views for explaining a method for manufacturing the SRAM cell of FIG. 8.
Figure 9B:
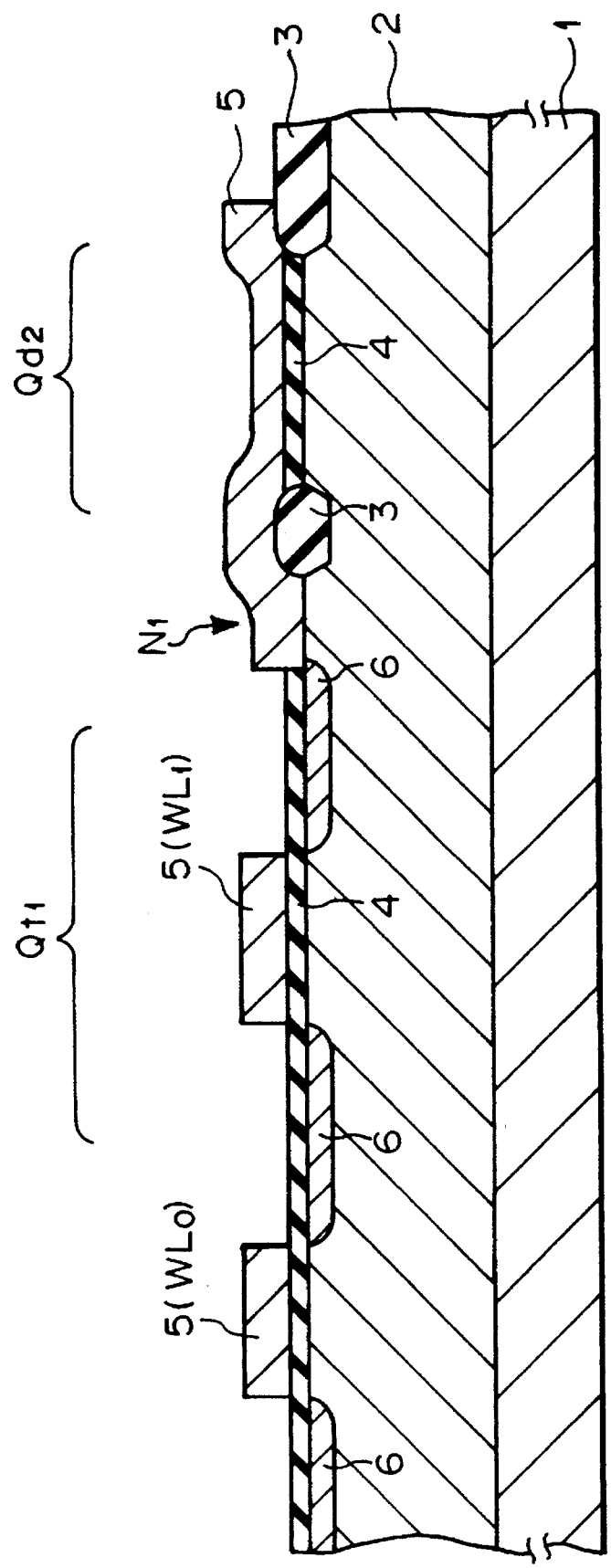
FIGS. 9B, 10B, 11B, 12B and 13B are cross-sectional views along the lines 20—20 of FIGS. 9A, 10A, 11A, 12A and 13A, respectively.

First, referring to FIGS. 9A and 9B, in the same way as in FIGS. 2A and 2B, P-type impurities such as boron are ion-implanted into an N-type monocrystalline silicon substrate 1, and a heat operation is carried out to form a P-type well layer 2. Next, a LOCOS operation is performed upon the P-type well layer 2 with a mask of silicon nitride (not shown) to create a thick field silicon oxide layer 3. Next, a thin gate silicon oxide layer 4 is formed by thermally oxidizing the P-type well layer 2. Then, polycrystalline silicon is deposited by a CVD process, and is patterned by a photolithography and dry etching process, to form first polycrystalline silicon layers 5 for gate electrodes of the transfer transistor $Q_{t1}$ and $Q_{t2}$ and the drive transistors $Q_{d1}$ and $Q_{d2}$. Then, N-type impurities such as arsenic are ion-implanted into the P-type well layer 2 with a mask of the first polycrystalline silicon layers 5, to create N-type impurity regions (i.e., source regions and drain regions) 6. In this case, the first polycrystalline silicon layers 5 are connected at contact holes CONT1 to the N-type impurity regions 6. Note the first polycrystalline silicon layer 5 ($WL_0$) belongs to an adjacent memory cell.

Figure 10A:
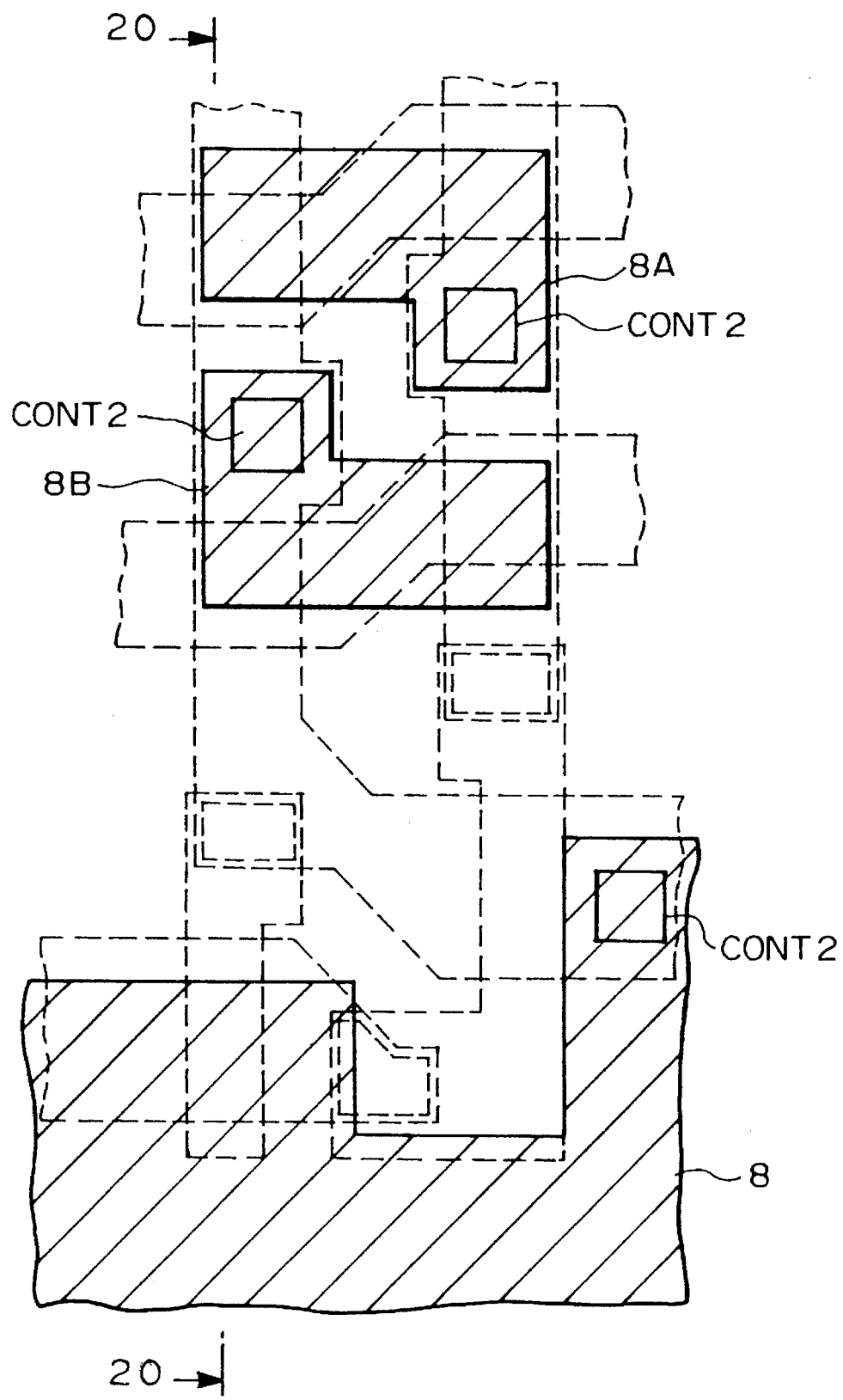
Figure 10B:
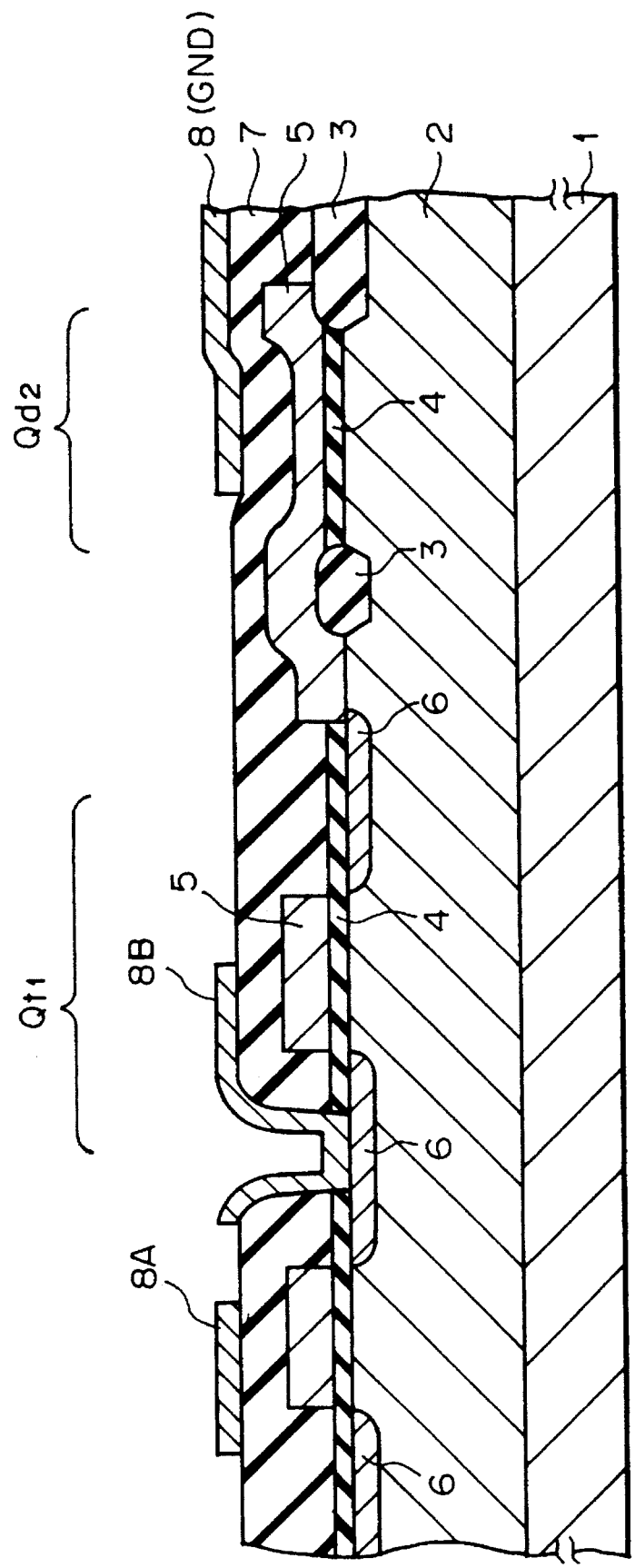

Next, referring to FIGS. 10A and 10B, in a similar way as in FIGS. 3A and 3B, a silicon oxide layer 7 is deposited by a CVD process, and then, a contact hole CONT2 is perforated in the silicon oxide layer 7. Then, second polycrystalline silicon layers 8, 8A and 8B are deposited and are patterned. This second polycrystalline silicon layer 8 serves as the ground line GND. The second polycrystalline silicon layer 8A serves as a connection for arranging the bit line $BL_2$ over the thin film transistor $Q_{t1}$, and the second polycrystalline silicon layer 8B serves as a connection for arranging the bit line $BL_1$ over the thin film transistor $Q_{t2}$. Also, in this case, note that the second polycrystalline silicon layers 8A and 8B do not reduce the integration of the SRAM cell as compared with the prior art SRAM cell (see FIGS. 3A and 3B).

Figure 11A:
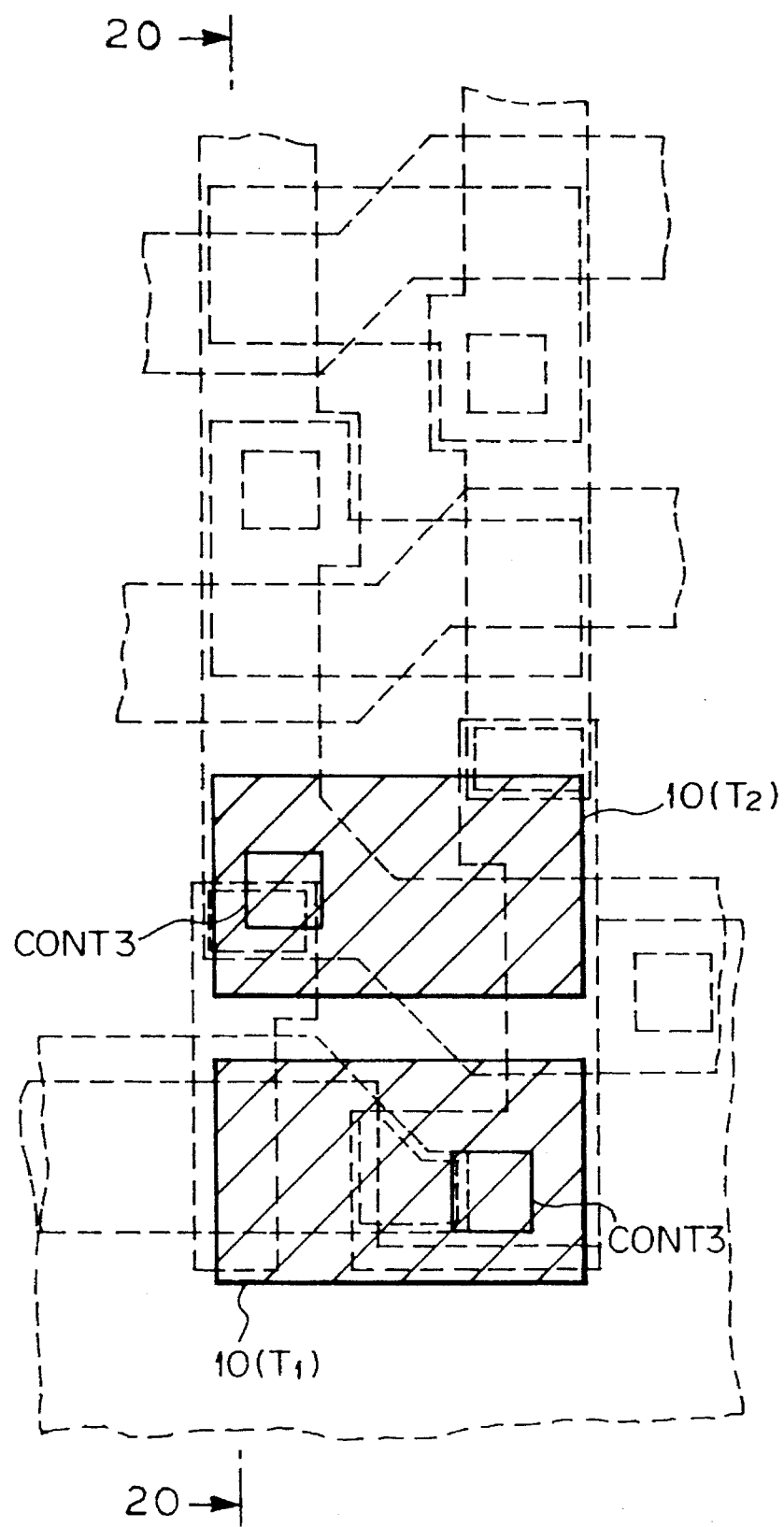
Figure 11B:
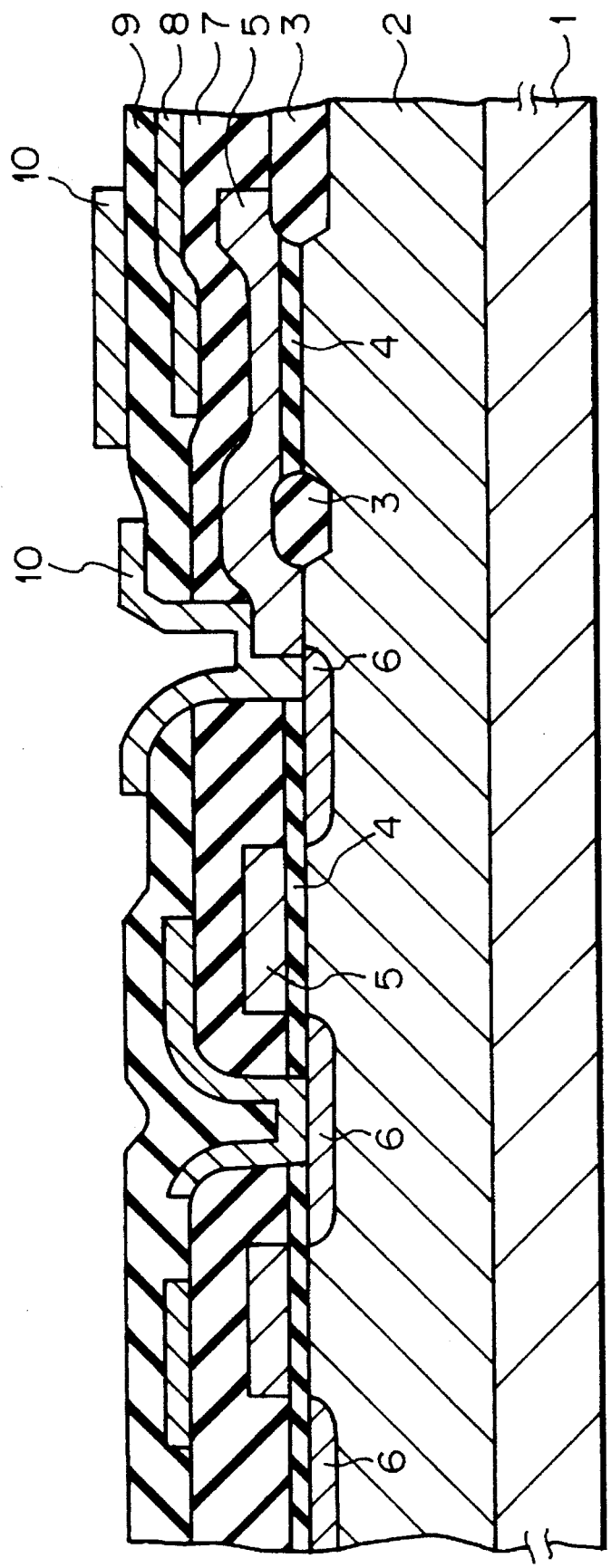

Next, referring to FIGS. 11A and 11B, in the same way as in FIGS. 4A and 4B, a silicon oxide layer 9 is deposited by a CVD process, and then, a contact hole CONT3 is perforated in the silicon oxide layer 9. Then, third polycrystalline silicon layers 10 are deposited and patterned. The third polycrystalline silicon layers 10 serve as the gate electrodes of the load thin film transistors $T_1$ and $T_2$.

Figure 12A:
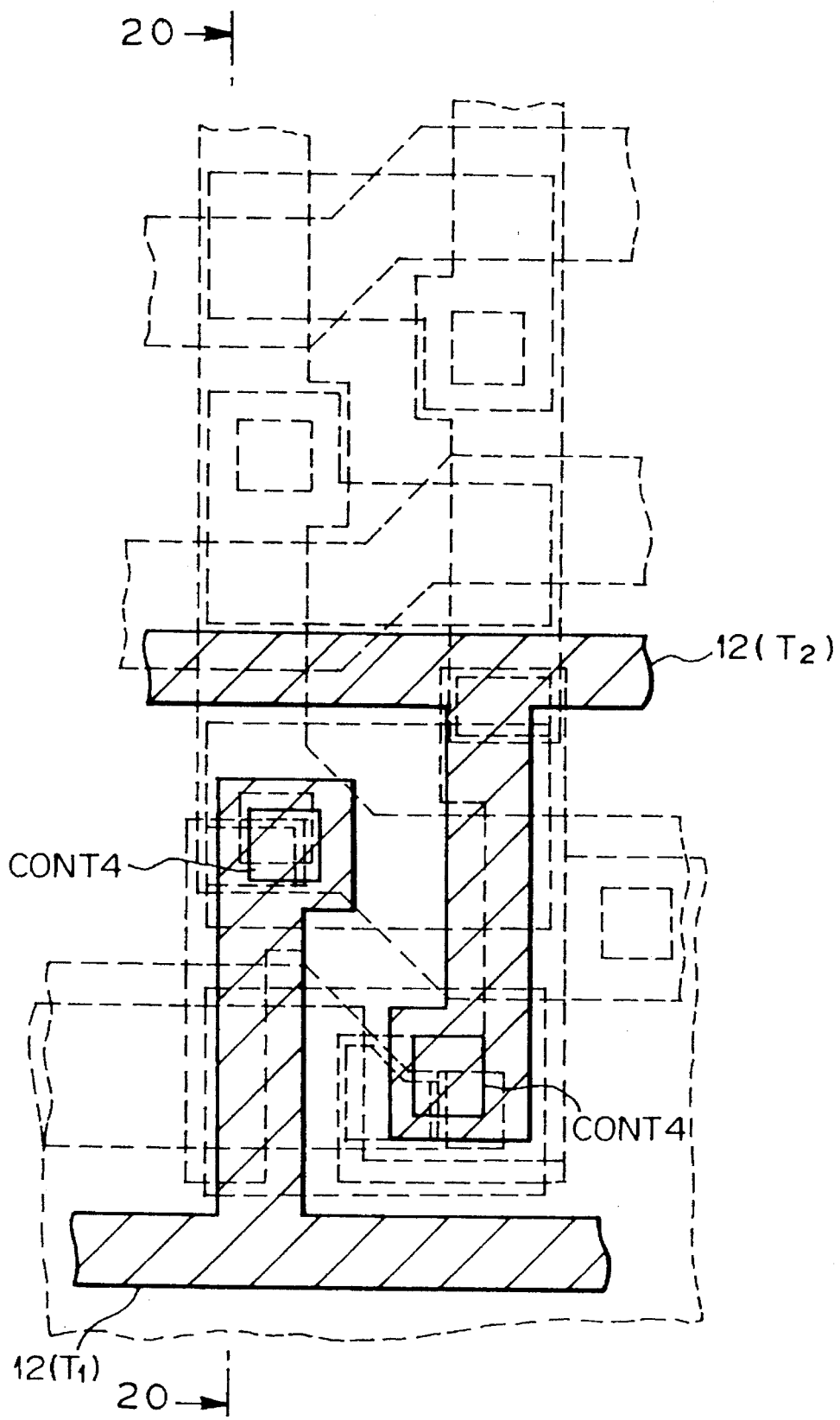
Figure 12B:
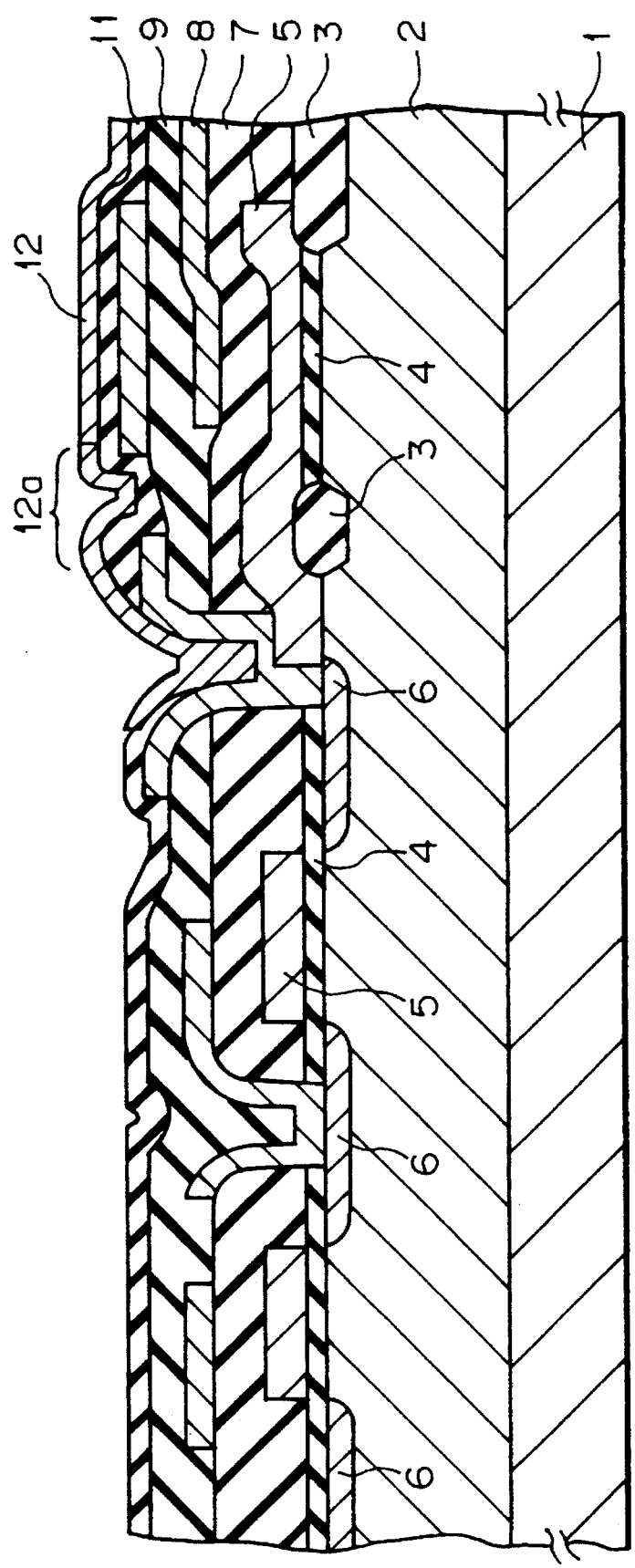

Next, referring to FIGS. 12A and 12B, in the same way as in FIGS. 5A and 5B, a silicon oxide layer 11 are deposited by a CVD process, and then, contact holes CONT4 is perforated in the silicon oxide layer 11. Then, amorphous silicon is deposited by a CVD process, and a heat operation is performed thereon to change the amorphous silicon to polycrystalline silicon. The polycrystalline silicon is patterned to form fourth polycrlystalline silicon layers 12. The fourth polycrystalline silicon layers 12 serve as source-channel-drain regions of the thin film transistors $T_1$ and $T_2$. Usually, in order to reduce the OFF current of the thin film transistors $T_1$ and $T_2$, a lean P-type impurity region 12a is provided in each of the drain regions of the thin film transistors $T_1$ and $T_2$, to thereby relax an electric field applied to the drain regions of the thin film transistors $T_1$ and $T_2$. For this purpose, P-type impurities such as boron fluoride are ion-implanted into an area indicated 12a in the fourth polycrystalline silicon layer 12.

Figure 13A:
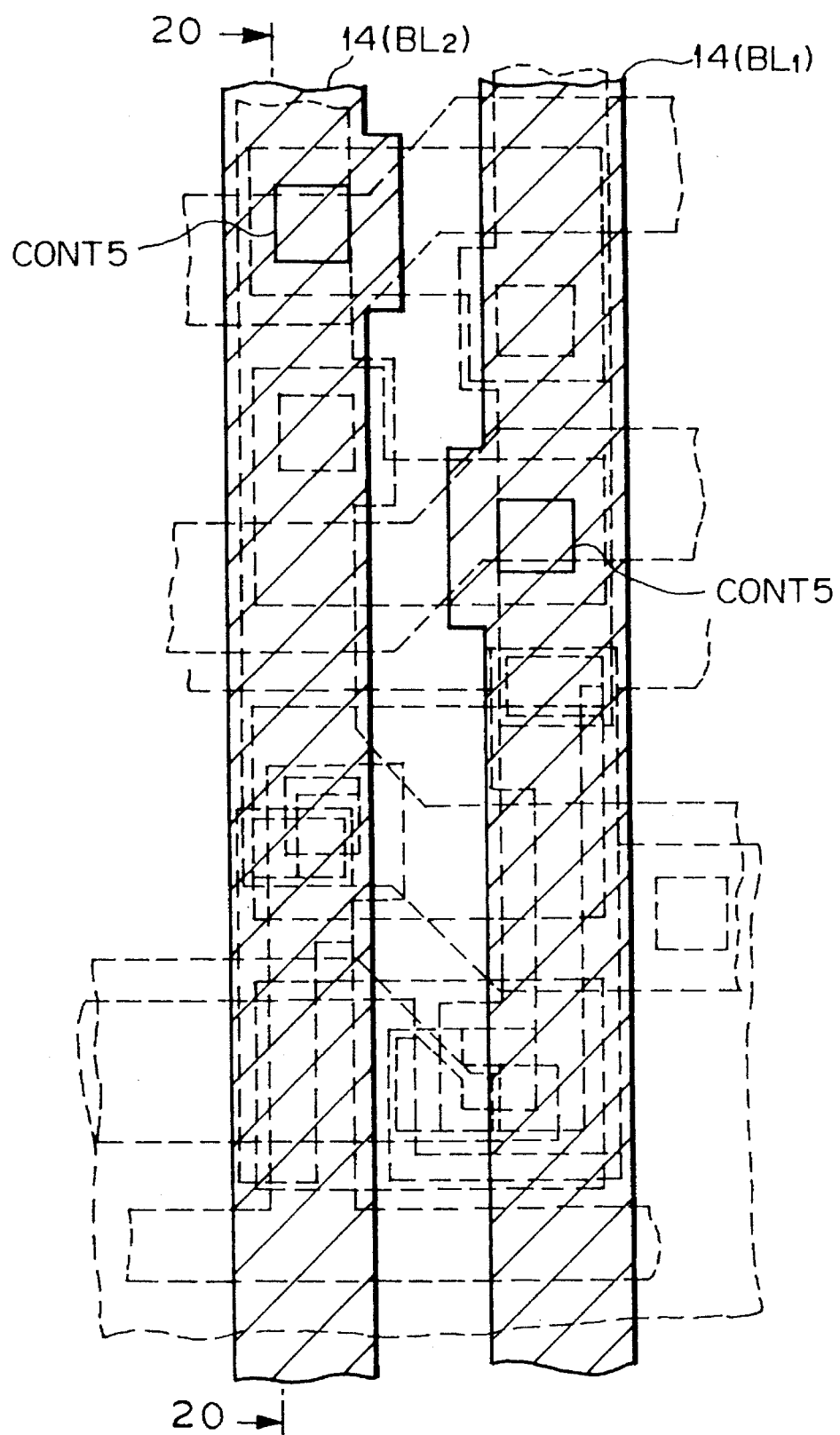
Figure 13B:
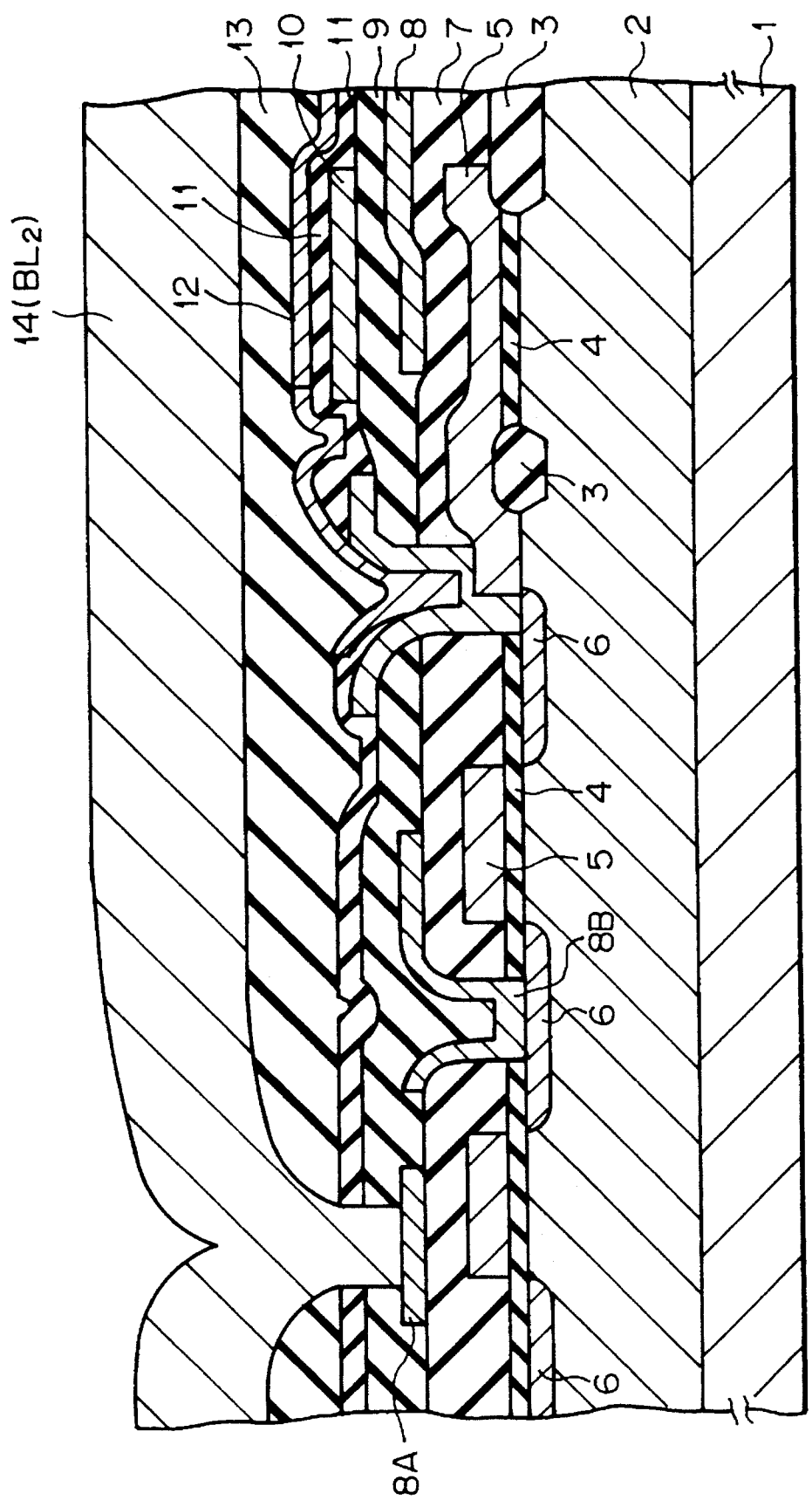

Finally, referring to FIGS. 13A and 13B, in a similar way as in FIGS. 6A and 6B, a silicon oxide layer 13 is deposited by a CVD process, and then, contact holes CONT5 are perforated in the silicon oxide layer 13. Then, aluminium alloy is deposited by sputtering, and then is patterned to form aluminum layers 14. The aluminum layers 14 serve as the bit lines $BL_1$ and $BL_2$. In this case, the aluminum layer 14 (the bit line $BL_2$) is connected to the second polycrystalline silicon layer 8A, and the aluminum layer 14 (the bit line $BL_1$) is connected to the second polycrystalline silicon layer 8B.

Thus, in the first embodiment, since the aluminium layer 14 (the bit line $BL_2$) is arranged over the source-channel-drain layer 13 of the thin film transistor $T_1$, the parasitic thin film transistor $T_3$ as illustrated in FIG. 8 is constructed by the bit line $BL_2$ and the source-channel-drain layer 13 of the thin film transistor $T_1$. Similarly, since the aluminium layer 14 (the bit line $BL_1$) is arranged over the source-channel-drain layer 13 of the thin film transistor $T_2$, the parasitic thin film transistor $T_4$ as illustrated in FIG. 8 is constructed by the bit line $BL_1$ and the source-channel-drain layer 13 of the thin film transistor $T_2$.

A write opration of the SRAM cell as illustrated in FIGS. 9A, 9B, 10A, 10B, 11A, 11B, 12A, 12B, 13A and 13B is explained in detail with reference to FIG. 8.

Also, assume that data "1" is witten into the SRAM cell of FIG. 8, and in this case, voltage at the bit line $BL_1$ is $V_{CC}$ and the voltage at the bit line $BL_2$ is GND.

When the voltage at the word line $WL_1$ is made high ($=V_{CC}$), the voltage $V_{N2}$ at the node $N_2$ becomes GND, since the transfer transistor $Q_{t2}$ is of an enhancement type, i.e., $$V_{N2}=GND$$

Conversely, the voltage $V_{N1}$ at the node $N_1$ becomes lower than $V_{CC}$ due to the enhancement type of the transfer transistor $Q_{t1}$, i.e., $$V_{N1}=V_{CC}-V_{th}-\alpha.$$

For example, $V_{CC}=5$ V, $V_{th}=0.7$ V, and $\alpha=0.7$ V, then, $$V_{N1}=3.6 \text{ V}$$

On the other hand, when the parasistic thin film transistor $T_3$ is present through the bit line $BL_2$ to which the ground voltage GND is applied, the thin film transistor $T_1$ is operated to be in an ON state as indicated by a curve C is FIG. 7, that is, the absolute value of the threshold voltage of the thin film transistor $T_1$ is substantially decreased.

Thus, when data "1" is written into the SRAM cell of FIG. 8, since the absolute value of the threshold voltage of the thin film transistor $T_1$ is substantially decreased by the parasitic thin film transistor $T_3$, the operation of the thin film transistor $T_1$ is enhanced by the parasitic thin film transistor $T_3$. That is, the ON current of the thin film transistor $T_1$ is increased about five times as compared with the prior art SRAM cell. In this case, the above-described time constant $\tau$ is reduced by about five times as compared with the prior art SRAM cell, and therefore, the charging time for the node $N_1$ to $V_{CC}$ is reduced by about five times as compared with the prior art SRAM cell. Thus, even when the power supply voltage $V_{CC}$ is changed from 5 V to 3 V, a margin of the operation of the SRAM cell of FIG. 8 is still large, i.e., the operation of the SRAM cell of FIG. 8 is stable.

Figure 14:
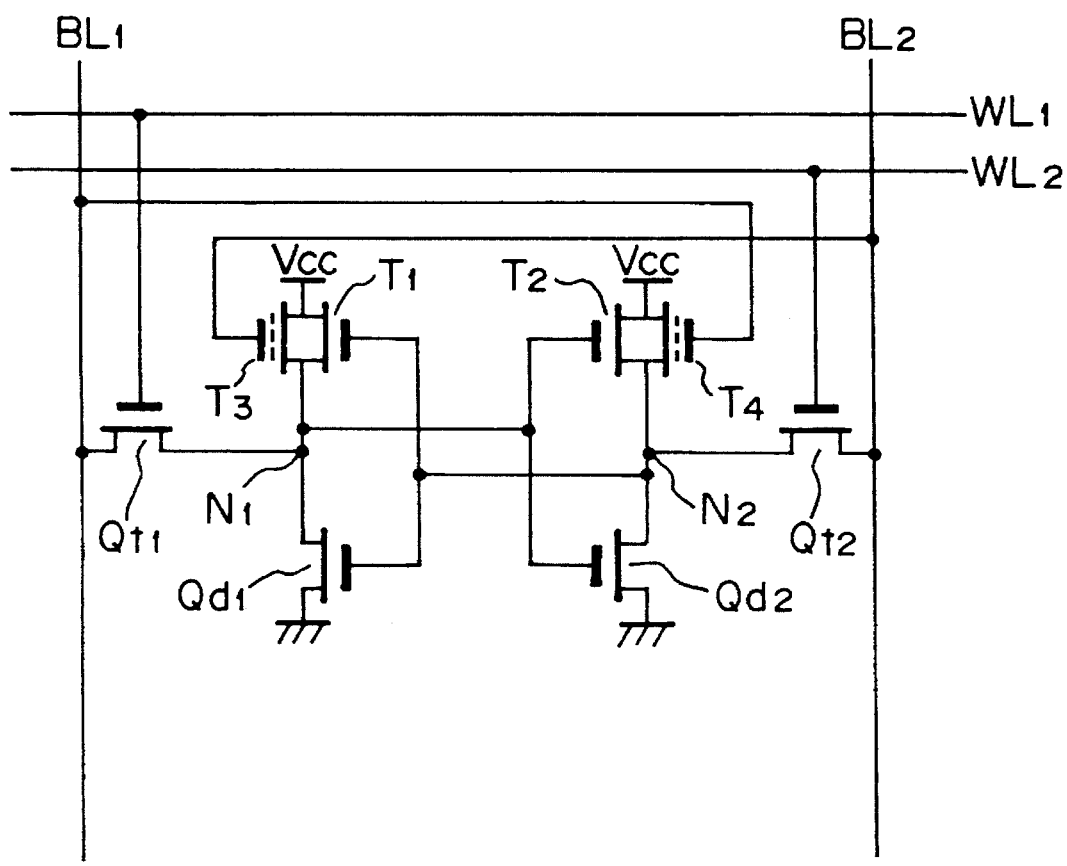
FIG. 14 is a circuit diagram illustrating a second embodiment of the SRAM cell according to the present invention.

In FIG. 14, which is a circuit diagram illustrating a second embodiment of the SRAM cell according to the present invention, a word line $WL_2$ to which the same voltage as the word line $WL_1$ is applied is added to the elements of the SRAM cell of FIG. 8. That is, the transfer transistor $Q_{t1}$ is controlled by the voltage at the word line $WL_1$, and the transfer transistor $Q_{t2}$ is controlled by the voltage at the word line $WL_2$.

The structure of the SRAM cell of FIG. 14, which is symmetrical with respect to a center of symmetry, is explained next with reference to FIGS. 15, 16, 17, 18 and 19.

Figure 15:
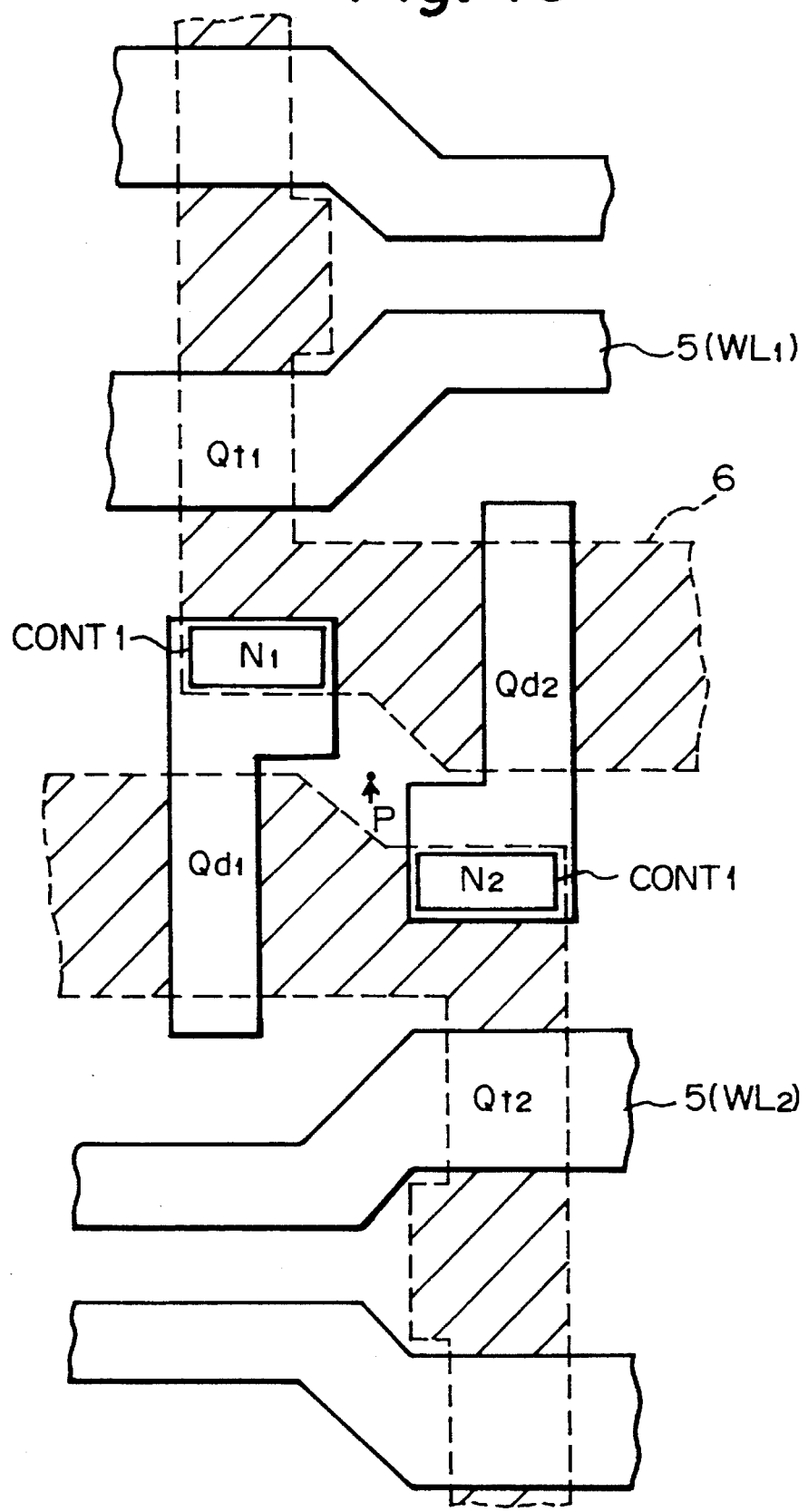
FIGS. 15, 16, 17, 18 and 19 are plan views for explaining a method for manufacturing the SRAM cell of FIG. 14.

First, referring to FIG. 15, which corresponds to FIG. 9A, the first polystalline silicon layer 5, i.e., the gate electrodes of the drive transistors $Q_{d1}$ and $Q_{d2}$, and the gate electrodes of the transfer transistors $Q_{t1}$ and $Q_{t2}$ (the word lines $WL_1$ and $WL_2$) are symmetrical with respect to a center P of symmetry.

Figure 16:
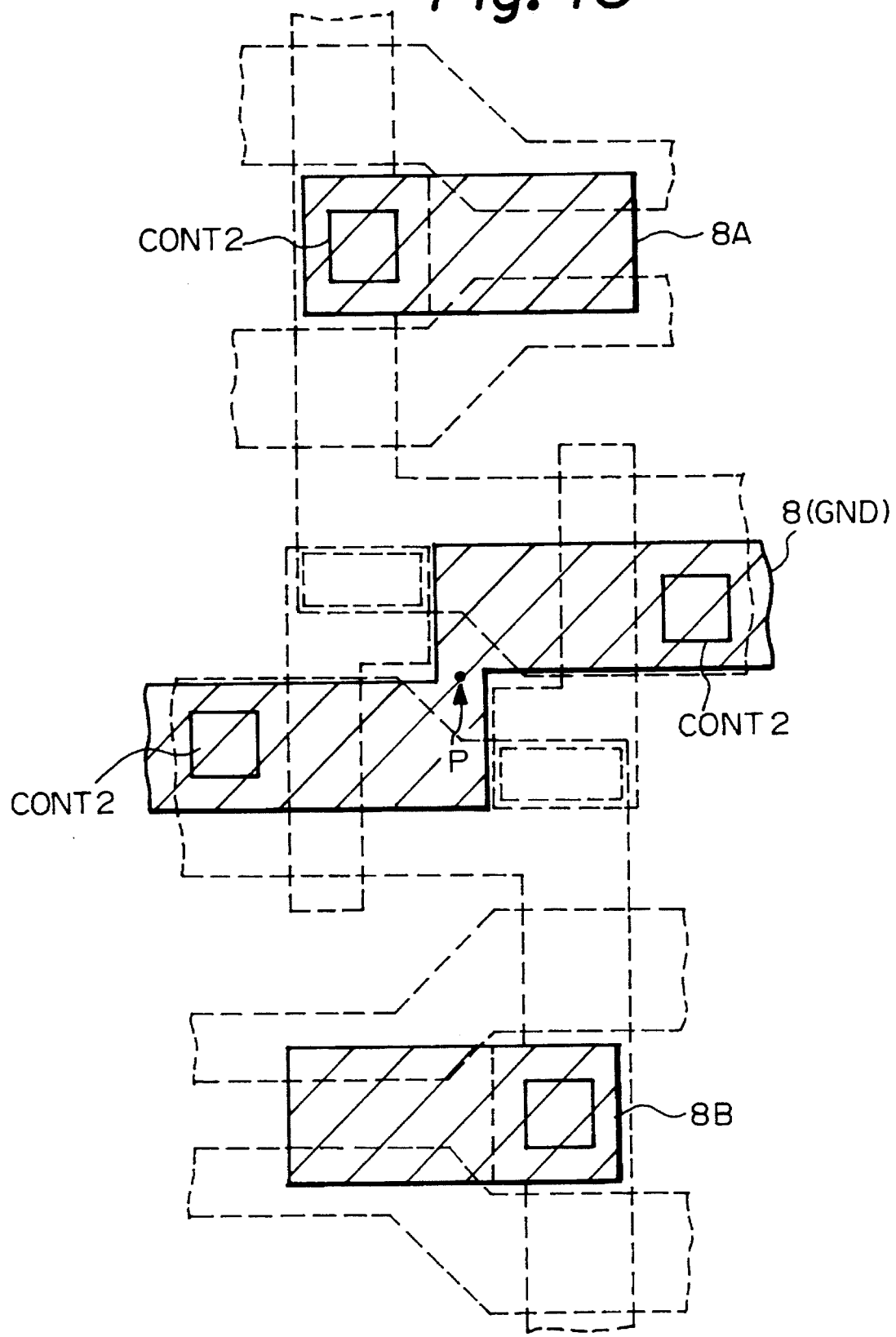

Next, referring to FIG. 16, which corresponds to FIG. 10A, the second polycrystalline silicon layers 8, 8A and 8B are symmetrical with respect to the center of symmetry P.

Figure 17:
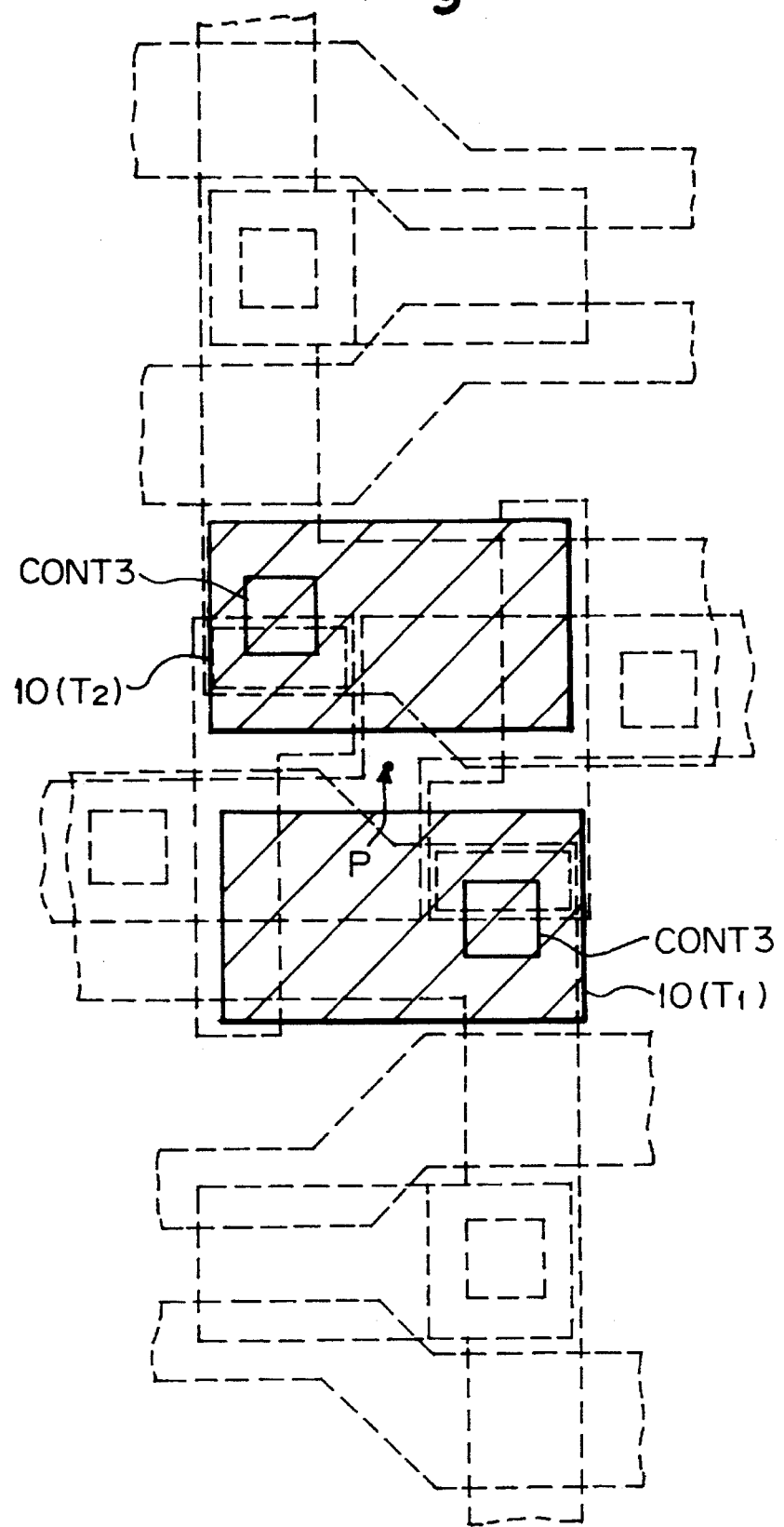

Next, referring to FIG. 17, which corresponds to FIG. 11A, the third polycrystalline silicon layers 10, i.e., the gate electrodes of the thin film transistors $T_1$ and $T_2$ are symmetrical with respect to the center of symmetry P.

Figure 18:
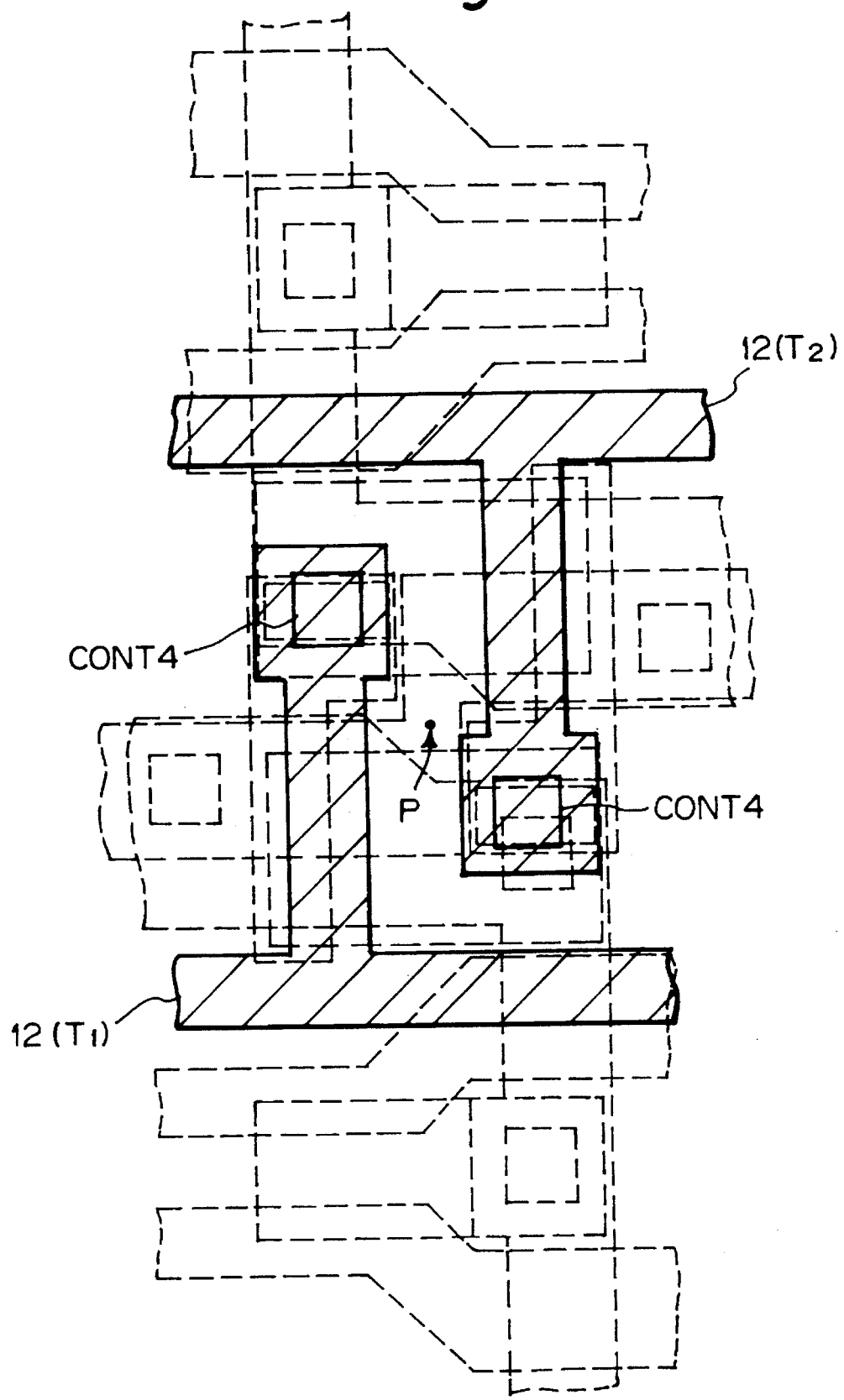

Next, referring to FIG. 18, which corresponds to FIG. 12A, the fourth polycrystalline silicon layers 12, i.e., the source-channel-drain layers of the thin film transistors $T_1$ and $T_2$ are symmetrical with respect to the center of symmetry P.

Figure 19:
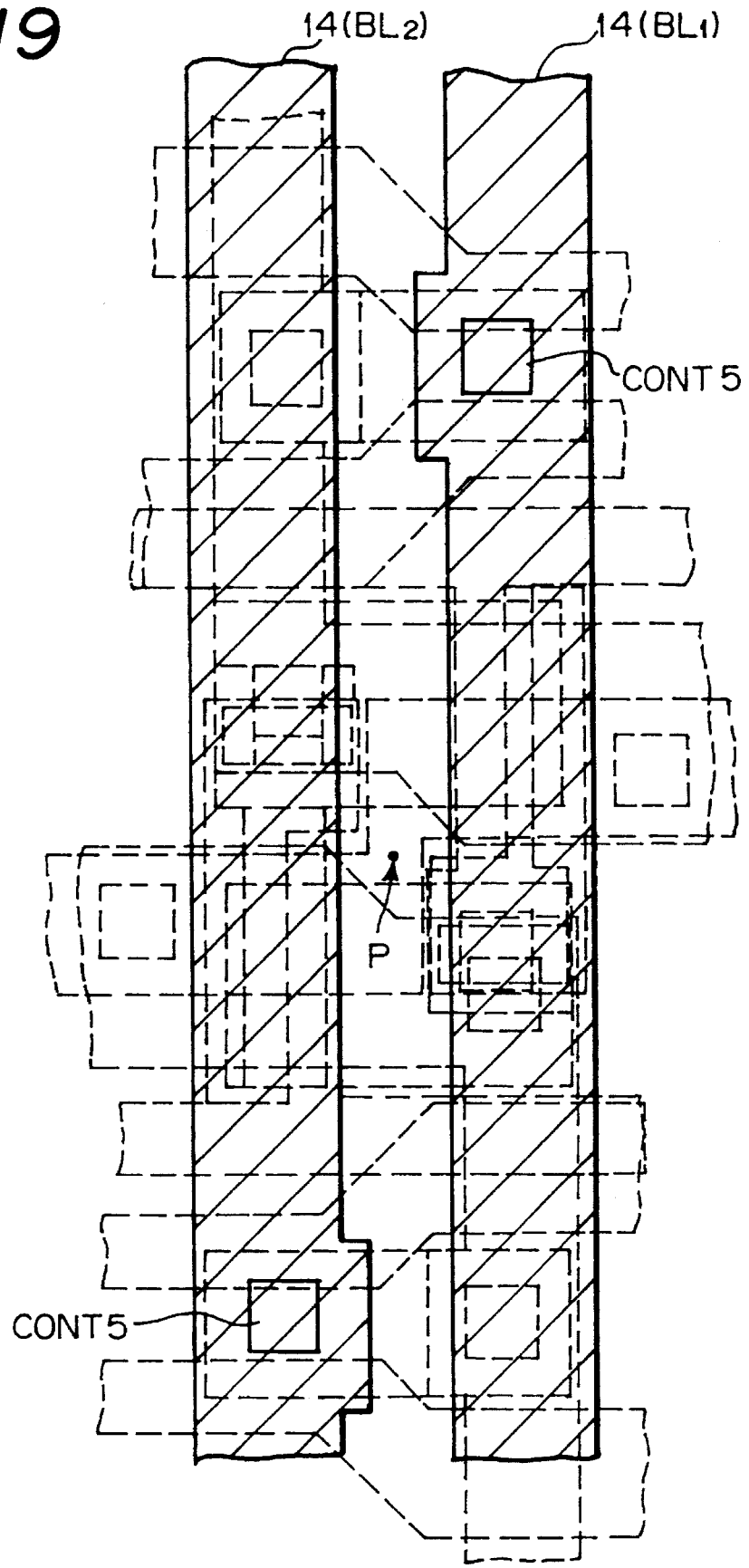

Finally, referring to FIG. 19, which corresponds to FIG. 13A, the aluminum layers 14, i.e., the bit lines $BL_1$ and $BL_2$ are symmetrical with respect to the center of symmetry P.

Thus, in the second embodiment, since the SRAM cell is symmetrical with respect to the center of symmetry P, the unbalance between the two inverters forming a flip-flop can be dissolved, to further stabilize the operation of the SRAM cell, i.e., reduce the power supply voltage $V_{CC}$ of the SRAM cell, in addition to the effect of the first embodiment.

As explained hereinbefore, according to the present invention, the operation of an SRAM cell can be stabilized, and the power supply voltage of the SRAM cell can be reduced.

I claim:

1. A static random access memory device comprising:

first and second power supply lines;

a word line;

first and second bit lines;

first and second nodes;

a first load thin film transistor connected between said first power supply line and said first node and having a gate electrode connected to said second node;

a second load thin film transistor connected between said first power supply line and said second node and having a gate electrode connected to said first node;

a first drive bulk transistor connected between said first node and said second power supply line and having a gate electrode connected to said second node;

a second drive bulk transistor connected between said second node and said second power supply line and having a gate electrode connected to said first node;

a first transfer bulk transistor connected between said first bit line and said first node and having a gate electrode connected to said word line; and a second transfer bulk transistor connected between said second bit line and said second node and having a gate electrode connected to said word line, said second bit line being arranged in the proximity of said first load thin film transistor to create a first parasitic load thin film transistor, said first bit line being arranged in the proximity of said second load thin film transistor to create a second parasitic load thin film transistor.

2. A device as set forth in claim 1, wherein said second bit line is located in an opposite side of said gate electrode of said first load thin film transistor in respect to a source-channel-drain layer thereof, said first bit line being located in an opposite side of said gate electrode of said second load thin film transistor in respect to a source-channel-drain layer thereof.

3. A static random access memory device comprising:

first and second power supply lines;

first and second word lines to which the same potential is applied;

first and second bit lines;

first and second nodes;

a first load thin film transistor connected between said first power supply line and said first node and having a gate electrode connected to said second node;

a second load thin film transistor connected between said first power supply line and said second node and having a gate electrode connected to said first node;

a first drive bulk transistor connected between said first node and said second power supply line and having a gate electrode connected to said second node;

a second drive bulk transistor connected between said second node and said second power supply line and having a gate electrode connected to said first node;

a first transfer bulk transistor connected between said first bit line and said first node and having a gate electrode connected to said first word line; and a second transfer bulk transistor connected between said second bit line and said second node and having a gate electrode connected to said second word line, said second bit line being arranged in the proximity of said first load thin film transistor to create a first parasitic load thin film transistor, said first bit line being arranged in the proximity of said second load thin film transistor to create a second parasitic load thin film transistor.

4. A device as set forth in claim 3, wherein said second bit line is located in an opposite side of said gate electrode of said first load thin film transistor in respect to a source-channel-drain layer thereof, said first bit line being located in an opposite side of said gate electrode of said second load thin film transistor in respect to a source-channel-drain layer thereof.

5. A device as set forth in claim 3, wherein said first and second word lines, said first and second bit lines, said first and second thin film transistors, said first and second drive bulk transistors, and said first second transfer bulk transistors are symmetrical with respect to one center of symmetry.

6. A static random access memory device including a flip-flop having first and second load thin film transistors whose drains are connected via first and second transfer bulk transistors to first and second bit lines, respectively, wherein said second bit line is arranged over said first load thin film transistor, and said first bit line is arranged over said second thin film transistor.

7. A static random access memory device including a flip-flop having first and second load thin film transistors whose drains are connected via first and second transfer bulk transistors to first and second bit lines, respectively, wherein a gate electrode of said first load thin film transistor is located beneath a channel region of said first load thin film transistor, and said second bit line is located over said channel region of said first load thin film transistor, and wherein a gate electrode of said second load thin film transistor is located beneath a channel region of said second load thin film transistor, and said first bit line is located over said channel region of said second load thin film transistor.

* * * * *